(12) United States Patent
Li et al.

(10) Patent No.: US 12,720,676 B2
(45) Date of Patent: Aug. 25, 2026

(54) CIRCUIT DEVICE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Dehui Li, Beijing (CN); Zhengkun Qian, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 452 days.

(21) Appl. No.: 18/548,098

(22) PCT Filed: Nov. 30, 2022

(86) PCT No.: PCT/CN2022/135458
§ 371 (c)(1),
(2) Date: Aug. 27, 2023

(87) PCT Pub. No.: WO2024/113228
PCT Pub. Date: Jun. 6, 2024

(65) Prior Publication Data
US 2025/0016913 A1 Jan. 9, 2025

(51) Int. Cl.
*H05K 1/02* (2006.01)
*H01Q 1/22* (2006.01)
(Continued)

(52) U.S. Cl.
CPC ............. *H05K 1/0277* (2013.01); *H01Q 1/22* (2013.01); *H01Q 1/526* (2013.01);
(Continued)

(58) Field of Classification Search
CPC .... H05K 1/0277; H05K 1/0216; H05K 1/165; H05K 1/118; H05K 2201/10098;
(Continued)

(56) References Cited

U.S. PATENT DOCUMENTS

2012/0026061 A1* 2/2012 Shachar .................... H01P 5/10
29/601
2014/0184461 A1 7/2014 Kim et al.
(Continued)

FOREIGN PATENT DOCUMENTS

CN 104485334 A 4/2015
CN 104837301 A * 8/2015 ............. H05K 3/425
(Continued)

OTHER PUBLICATIONS

International Search Report & Written Opinion mailed Aug. 16, 2023, regarding PCT/CN2022/135458.

*Primary Examiner* — Timothy J Thompson
*Assistant Examiner* — Amol H Patel
(74) *Attorney, Agent, or Firm* — Intellectual Valley Law, P.C.

(57) ABSTRACT

A circuit device is provided. The circuit device includes a flexible printed circuit portion and an antenna portion. The circuit device includes a base substrate having a unitary structure extending from a region of the antenna portion to a region of the flexible printed circuit portion; and a first conductive layer on a first side of the base substrate. The first conductive layer includes one or more coil lines in the antenna portion and one or more first conductive lines in the flexible printed circuit portion.

18 Claims, 9 Drawing Sheets

(51) Int. Cl.

| | |
|---|---|
| ***H01Q 1/38*** | (2006.01) |
| ***H01Q 1/52*** | (2006.01) |
| ***H05K 1/11*** | (2006.01) |
| ***H05K 1/16*** | (2006.01) |
| ***H10K 59/10*** | (2023.01) |

(52) U.S. Cl.
CPC ........... *H05K 1/0216* (2013.01); *H05K 1/165* (2013.01); *H05K 2201/10098* (2013.01); *H05K 2201/10128* (2013.01)

(58) Field of Classification Search
CPC ..... H05K 2201/10128; G06G 2380/02; G06G 2380/06; H10K 59/10
See application file for complete search history.

(56) References Cited

U.S. PATENT DOCUMENTS

| | | | | |
|---|---|---|---|---|
| 2016/0329363 | A1 | 11/2016 | He et al. | |
| 2021/0232186 | A1 | 7/2021 | Tian et al. | |
| 2021/0241952 | A1* | 8/2021 | Weidinger | H05K 1/165 |
| 2024/0138068 | A1* | 4/2024 | Adair | A24F 40/465 |

FOREIGN PATENT DOCUMENTS

| | | | | | |
|---|---|---|---|---|---|
| CN | 106057662 | A | | 10/2016 | |
| CN | 109407369 | A | | 3/2019 | |
| CN | 109844953 | A | | 6/2019 | |
| CN | 111525232 | A | | 8/2020 | |
| CN | 114664237 | A | | 6/2022 | |
| CN | 114822263 | A | * | 7/2022 | H01Q 7/00 |
| JP | 2015130450 | A | | 7/2015 | |

* cited by examiner

CIRCUIT DEVICE AND DISPLAY APPARATUS

CROSS-REFERENCE TO RELATED APPLICATION

This application is a national stage application under 35 U.S.C. § 371 of International Application No. PCT/CN2022/135458, filed Nov. 30, 2022, the contents of which are incorporated by reference in the entirety.

TECHNICAL FIELD

The present invention relates to display technology, more particularly, to a circuit device and a display apparatus.

BACKGROUND

A flexible display apparatus is a bendable or deformable display apparatus having a flexible display panel. Examples of flexible display apparatuses include a flexible organic light emitting diode (OLED) display apparatus, a flexible electrophoretic display (EPD) apparatus, and a flexible liquid crystal display (LCD) apparatus. As a new generation display apparatus, the flexible display apparatus is thinner and lighter, having high contrast, high responsiveness, and high brightness. It also provides full color and a wide viewing angle. The flexible display apparatus has found a wide range of applications in mobiles phones, personal digital assistance (PDAs), digital cameras, on-board displays, notebook computers, on-wall televisions, as well as various military applications. A flexible display apparatus includes a flexible array substrate. A base substrate of the flexible array substrate can be made of flexible material such as plastic.

SUMMARY

In one aspect, the present disclosure provides a circuit device, comprising a flexible printed circuit portion and an antenna portion; wherein the circuit device comprises a base substrate having a unitary structure extending from a region of the antenna portion to a region of the flexible printed circuit portion; and a first conductive layer on a first side of the base substrate; wherein the first conductive layer comprises one or more coil lines in the antenna portion and one or more first conductive lines in the flexible printed circuit portion.

Optionally, the circuit device further comprises a connector configured to connect the circuit device with a motherboard of a display apparatus; wherein the one or more coil lines in the antenna portion is directly connected to the connector.

Optionally, the circuit device further comprises a first coverlay layer on a side of the first conductive layer away from the base substrate; wherein an orthographic projection of the first coverlay layer on the base substrate at least partially overlaps with an orthographic projection of the one or more coil lines on the base substrate, and at least partially overlaps with an orthographic projection of the one or more first conductive lines on the base substrate.

Optionally, the circuit device further comprises a magnetic field enhancing layer on the first side of the base substrate, the magnetic field enhancing layer being configured to enhance a magnetic field generated by the one or more coil lines; wherein the one or more coil lines substantially surrounds the magnetic field enhancing layer.

Optionally, the magnetic field enhancing layer comprises a magnetic field enhancing material; and the magnetic field enhancing material comprises a metal or an alloy.

Optionally, the circuit device further comprises a first electromagnetic interference shielding layer on a side of a first coverlay layer away from the base substrate, the first electromagnetic interference shielding layer being configured to shield the flexible printed circuit portion from electromagnetic waves; wherein an orthographic projection of the first electromagnetic interference shielding layer on the base substrate at least partially overlaps with an orthographic projection of the one or more first conductive lines in the flexible printed circuit portion on the base substrate.

Optionally, the circuit device further comprises an adhesive layer on a side of a first coverlay layer and a first electromagnetic interference shielding layer away from the base substrate; wherein the adhesive layer is configured to adhere the circuit device to a display panel; and the adhesive layer has a unitary structure extending from a region of the antenna portion to a region of the flexible printed circuit portion.

Optionally, the circuit device further comprises a second conductive layer on a second side of the base substrate, the second side being opposite to the first side; wherein the second conductive layer is configured to shield the flexible printed circuit portion from electromagnetic waves; and an orthographic projection of the second conductive layer on the base substrate at least partially overlaps with an orthographic projection of the one or more first conductive lines in the flexible printed circuit portion on the base substrate.

Optionally, the circuit device further comprises a magnetic material layer on a second side of the base substrate, the second side being opposite to the first side; wherein the magnetic material layer is configured to guide magnetic flux generated by the one or more coil lines; and an orthographic projection of the magnetic material layer on the base substrate at least partially overlaps with an orthographic projection of the one or more coil lines and/or a magnetic field enhancing layer on the base substrate.

Optionally, the magnetic material layer comprises a ferrimagnetic material.

Optionally, the circuit device further comprises a second coverlay layer on a side of a second conductive layer away from the base substrate; wherein an orthographic projection of the second coverlay layer on the base substrate at least partially overlaps with an orthographic projection of the one or more first conductive lines on the base substrate.

Optionally, the second coverlay layer has a unitary structure extending from a region of the antenna portion to a region of the flexible printed circuit portion; and the orthographic projection of the second coverlay layer on the base substrate at least partially overlaps with an orthographic projection of the one or more coil lines on the base substrate.

Optionally, the circuit device further comprises a second electromagnetic interference shielding layer on a side of a second coverlay layer away from the base substrate, the second electromagnetic interference shielding layer being configured to shield the flexible printed circuit portion from electromagnetic waves; wherein an orthographic projection of the second electromagnetic interference shielding layer on the base substrate at least partially overlaps with an orthographic projection of the one or more first conductive lines in the flexible printed circuit portion on the base substrate.

Optionally, the second electromagnetic interference shielding layer has a unitary structure extending from a region of the antenna portion to a region of the flexible printed circuit portion; and the orthographic projection of the second electromagnetic interference shielding layer on the base substrate at least partially overlaps with an orthographic projection of the one or more coil lines in the antenna portion on the base substrate.

Optionally, the circuit device further comprises a shielding layer on a side of a second coverlay layer away from the base substrate, the shielding layer being configured to shield the flexible printed circuit portion from electromagnetic waves; wherein an orthographic projection of the shielding layer on the base substrate at least partially overlaps with an orthographic projection of the one or more first conductive lines in the flexible printed circuit portion on the base substrate; the shielding layer has a unitary structure extending from a region of the antenna portion to a region of the flexible printed circuit portion; and the orthographic projection of the shielding layer on the base substrate at least partially overlaps with an orthographic projection of the one or more coil lines in the antenna portion on the base substrate.

Optionally, the circuit device further comprises a protective layer on a side of a second electromagnetic interference shielding layer or a shielding layer away from the base substrate.

Optionally, the one or more coil lines has a first thickness greater than a second thickness of the one or more first conductive lines.

Optionally, the one or more coil lines have a first average line width; the one or more first conductive lines have a second average line width; the first average line width is greater than the second average line width; coil lines of the one or more coil lines are spaced apart by a first average distance; first conductive lines of the one or more first conductive lines are spaced apart by a second average distance; and the first average distance is greater than the second average distance.

In another aspect, the present disclosure provides a display apparatus, comprising the circuit device described herein, and a display panel connected to the circuit device.

Optionally, the display apparatus comprises a stacked structure; wherein the stacked structure comprises a cover; the display panel on the cover; an adhesive layer on a side of the display panel away from the cover; a first electromagnetic interference shielding layer on a side of the adhesive layer away from the cover; a first coverlay layer on a side of the first electromagnetic interference shielding layer away from the cover; the first conductive layer on a side of the first coverlay layer away from the cover; and the base substrate on a side of the first conductive layer away from the cover.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating related display apparatuses (e.g., a smart watch), a flexible printed circuit and an antenna (e.g., a near field communication chip) are assembled onto a display panel (e.g., a flexible display panel). Typically, in the related display apparatuses, the antenna is first soldered onto the flexible printed circuit, and the welded combination is then assembled onto the display panel, forming the display apparatus. The inventors of the present disclosure discover that there are several issues associated with the related fabrication process. The solder joint is prone to break and failure, leading to connectivity defects. The soldering process produces dust and contaminants, making it unsuitable to be performed in display panel production site having strict requirements for a dust-free environment. Commercial antennas typically have a larger area. When soldering the antenna onto the flexible printed circuit, typically the antenna overlays a portion of the flexible printed circuit. The magnetic field produced by the antenna adversely affects the flexible printed circuit. To prevent flicker in the display panel when it is charged wireless, typically a layer of metal foil is applied on the antenna and the flexible printed circuit. Commercial antenna and flexible printed circuit typically have different thickness, making it difficult to apply the metal foil onto the soldered unit. The application of the metal foil often becomes loose, and the metal foil is prone to wrinkle defects.

Accordingly, the present disclosure provides, inter alia, a circuit device and a display apparatus that substantially obviate one or more of the problems due to limitations and disadvantages of the related art. In one aspect, the present disclosure provides a circuit device. In some embodiments, the circuit device includes a flexible printed circuit portion and an antenna portion. Optionally, the circuit device includes a base substrate having a unitary structure extending from a region of the antenna portion to a region of the flexible printed circuit portion; and a first conductive layer on a first side of the base substrate. Optionally, the first conductive layer comprises one or more coil lines in the antenna portion and one or more first conductive lines in the flexible printed circuit portion.

Figure 1:
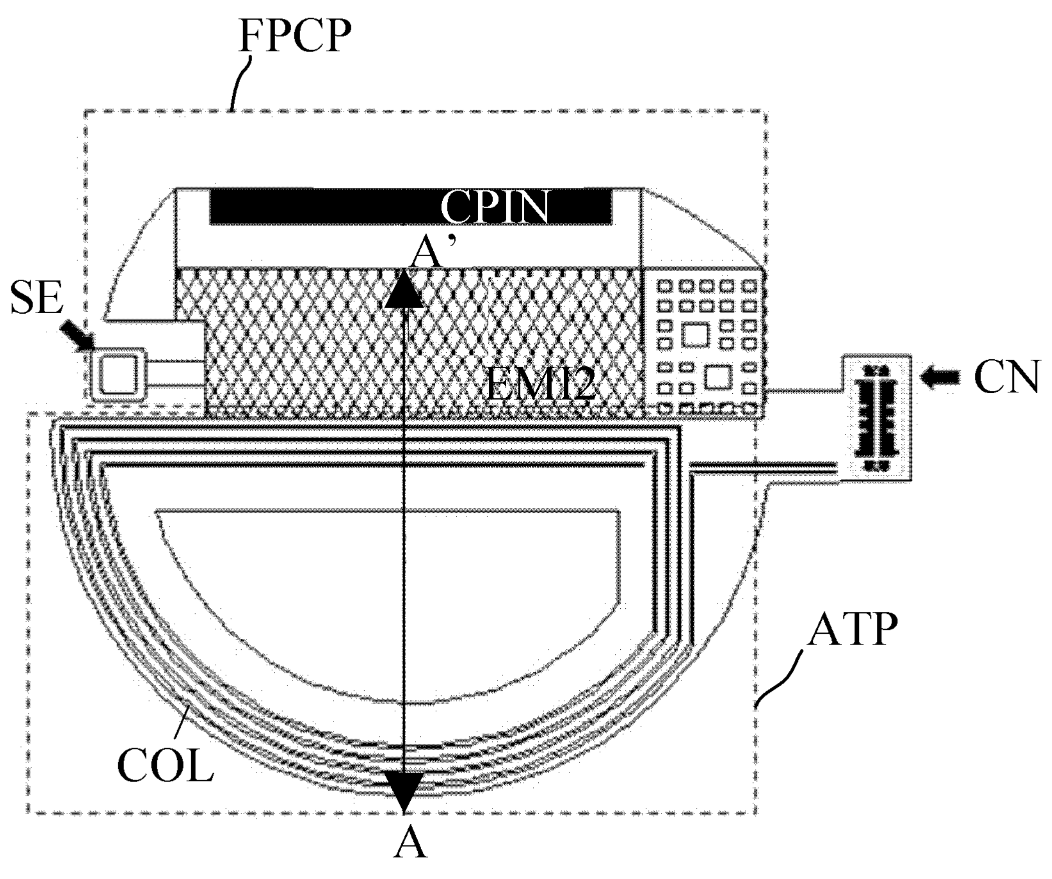
FIG. 1 is a schematic diagram illustrating the structure of a circuit device in some embodiments according to the present disclosure.

FIG. 1 is a schematic diagram illustrating the structure of a circuit device in some embodiments according to the present disclosure. Referring to FIG. 1, the circuit device in some embodiments includes a flexible printed circuit portion FPCP and an antenna portion ATP, e.g., integrated together. As used herein, the term "integrated" refers to that at least one layer in the flexible printed circuit portion FPCP and at least one layer in the antenna portion ATP are formed in a same process and using a same material. In one example, the flexible printed circuit portion FPCP includes multiple layers, and the antenna portion ATP includes multiple layers. A respective layer of the multiple layers in the flexible printed circuit portion FPCP and a corresponding layer of the multiple layers in antenna portion ATP are formed in a same process and using a same material. The antenna portion ATP includes an antenna, e.g., a near field communication circuit. Optionally, the antenna portion ATP includes one or more coil lines COL. The flexible printed circuit portion FPCP includes a plurality of circuit pins CPIN for bonding with one or more integrated circuits of the display panel. Optionally, the flexible printed circuit portion FPCP includes one or more electromagnetic interference shielding layer (e.g., a second electromagnetic interference shielding layer EMI2 depicted in FIG. 1) configured to shield the circuit device from electromagnetic waves. For example, the one or more electromagnetic interference shielding layer may be configured to shield the circuit device from electromagnetic waves generated during wireless charging of the display panel.

In some embodiments, the circuit device further includes a connector CN configured to connect the circuit device with a motherboard of a display apparatus. The motherboard includes various components including a processor, a microcontroller unit, or an integrated circuit. The connector CN is integrated with the antenna portion ATP and the flexible printed circuit portion FPCP. As shown in FIG. 1, the one or more coil lines COL in the antenna portion ATP is directly connected to the connector CN. For example, the one or more coil lines COL in the antenna portion ATP are formed in a same process and using a same material as one or more signal lines in the connector CN. Soldering of the antenna portion is not required, obviating connectivity defects due to solder joint break or failure.

In some embodiments, the circuit device further includes a sensor SE integrated with the flexible printed circuit portion FPCP. In one example, the sensor SE is a photosensor.

Figure 2A:
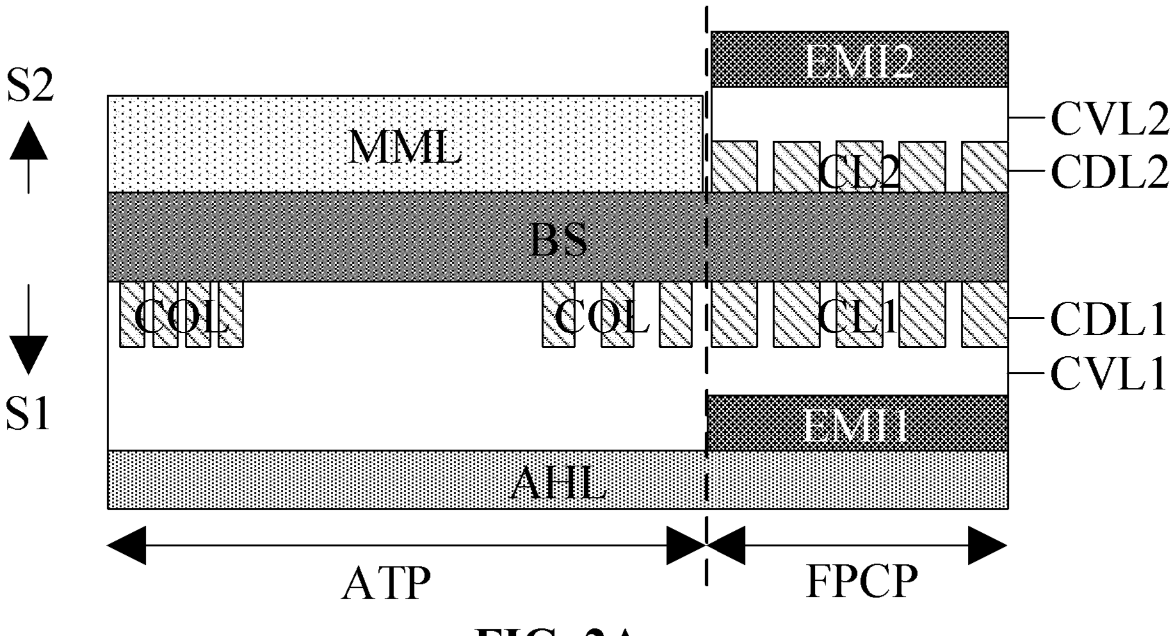
FIG. 2A is a cross-sectional view of a circuit device in some embodiments according to the present disclosure.

FIG. 2A is a cross-sectional view of a circuit device in some embodiments according to the present disclosure. For example, FIG. 2A may be a cross-sectional view along an A-A' line in FIG. 1. Referring to FIG. 1 and FIG. 2A, the circuit device in some embodiments includes a base substrate BS, a first conductive layer CDL1 on a first side S1 of the base substrate BS, a first coverlay layer CVL1 on a side of the first conductive layer CDL1 away from the base substrate BS. The base substrate BS is a unitary structure extending from a region of the antenna portion ATP to a region of the flexible printed circuit portion FPCP. Optionally, the first coverlay layer CVL1 is a unitary structure extending from a region of the antenna portion ATP to a region of the flexible printed circuit portion FPCP.

In some embodiments, the first conductive layer CDL1 includes one or more coil lines COL in the antenna portion ATP and one or more first conductive lines CL1 in the flexible printed circuit portion FPCP. The one or more coil lines COL in the antenna portion ATP and the one or more first conductive lines CL1 in the flexible printed circuit portion FPCP are in a same layer. As used herein, the term "same layer" refers to the relationship between the layers simultaneously formed in the same step. In one example, the one or more coil lines COL and the one or more first conductive lines CL1 are in a same layer when they are formed as a result of one or more steps of a same patterning process performed in a material deposited in a same deposition process. In another example, the one or more coil lines COL and the one or more first conductive lines CL1 can be formed in a same layer by simultaneously performing the step of forming the one or more coil lines COL and the step of forming the one or more first conductive lines CL. The term "same layer" does not always mean that the thickness of the layer or the height of the layer in a cross-sectional view is the same.

The inventors of the present disclosure discover that, by having the one or more coil lines COL in the antenna portion ATP and the one or more first conductive lines CL1 in the flexible printed circuit portion FPCP in a same layer, the effect of the magnetic field generated by the one or more coil lines COL in the antenna portion ATP on the flexible printed circuit portion FPCP can be reduced or minimized.

Various appropriate conductive materials and various appropriate fabricating methods may be used to make the first conductive layer CDL1. For example, a conductive metal material may be deposited on the substrate by magnetron sputtering, vapor deposition (e.g., plasma-enhanced chemical vapor deposition), or vacuum deposition. Examples of appropriate conductive metal materials for making the first conductive layer CDL1 include, but are not limited to, copper, titanium, tantalum, aluminum, molybdenum, chromium, and various alloys or laminates thereof.

Figures 2B, 2C:
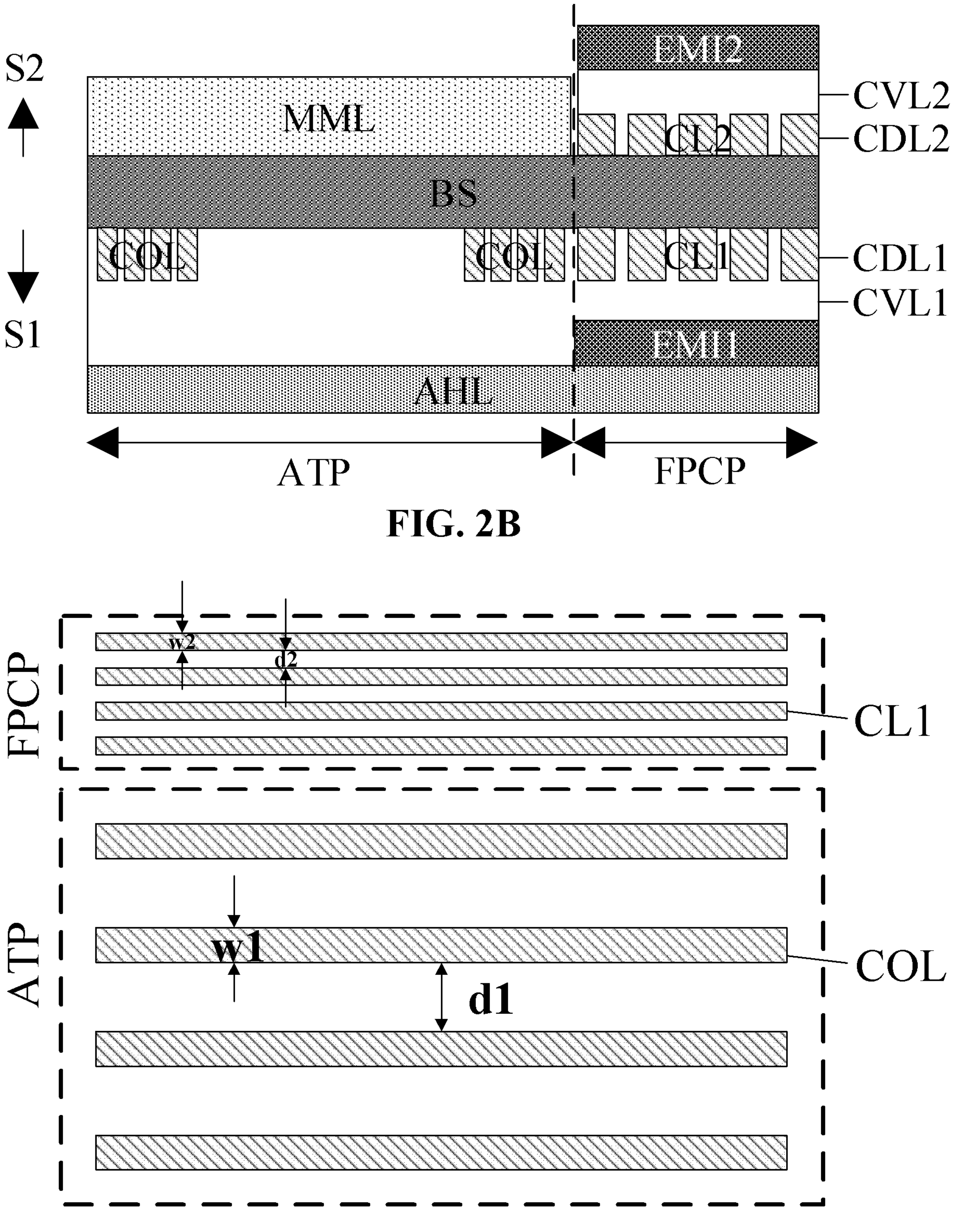
FIG. 2B is a cross-sectional view of a circuit device in some embodiments according to the present disclosure.
FIG. 2C illustrates the layout of one or more coil lines and one or more first conductive lines in some embodiments according to the present disclosure.

FIG. 2B is a cross-sectional view of a circuit device in some embodiments according to the present disclosure. Referring to FIG. 1, FIG. 2A, and FIG. 2B, the one or more coil lines COL in the antenna portion ATP have a plurality of turns for generating inductance.

In FIG. 2B, the one or more coil lines COL in the antenna portion ATP are equidistant. For example, the one or more coil lines COL have a plurality of turns surrounding a center. On a same side with respect to the center, distances between adjacent coil lines of the one or more coil lines COL are substantially the same.

In FIG. 2A, the one or more coil lines COL have a plurality of turns surrounding a center. On a same side with respect to the center, at least two inter-coil line distances between at least two pairs of adjacent coil lines of the one or more coil lines COL are different from each other.

Various appropriate materials may be used for making the base substrate. Examples of materials suitable for making the base substrate include, but are not limited to, polyimide, polyester, glass, quartz, silicon oxide (SiOy), silicon nitride (SiNy, e.g., Si3N4), and silicon oxynitride (SiOxNy).

Various appropriate insulating materials and various appropriate fabricating methods may be used to make the first coverlay layer CVL1. In some embodiments, the first coverlay layer CVL1 includes a plurality of sub-layers. Optionally, the plurality of sub-layers include an insulating material sub-layer and an adhesive sub-layer. The adhesive sub-layer adheres the insulating material sub-layer to an adjacent layer (e.g., the first conductive layer CDL1).

In some embodiments, an orthographic projection of the first coverlay layer CVL1 on the base substrate BS at least partially overlaps with an orthographic projection of the first conductive layer CDL1 on the base substrate BS. Optionally, the orthographic projection of the first coverlay layer CVL1 on the base substrate BS covers the orthographic projection of the first conductive layer CDL1 on the base substrate BS.

In some embodiments, the circuit device further includes a first electromagnetic interference shielding layer EMI1 on a side of the first coverlay layer CVL1 away from the base substrate BS. The first electromagnetic interference shielding layer EMI1 is configured to shield the circuit device (e.g., the flexible printed circuit portion FPCP) from electromagnetic waves. For example, the first electromagnetic interference shielding layer EMI1 may be configured to shield the flexible printed circuit portion FPCP from electromagnetic waves generated during wireless charging of the display panel.

Optionally, the first electromagnetic interference shielding layer EMI1 is at least partially in the flexible printed circuit portion FPCP. Optionally, the first electromagnetic interference shielding layer EMI1 is at least partially absent in the antenna portion ATP. Optionally, the first electromagnetic interference shielding layer EMI1 is completely absent in the antenna portion ATP.

In some embodiments, an orthographic projection of the first electromagnetic interference shielding layer EMI1 on the base substrate BS at least partially overlaps with an orthographic projection of the one or more first conductive lines CL1 in the flexible printed circuit portion FPCP on the base substrate BS. Optionally, the orthographic projection of the first electromagnetic interference shielding layer EMI1 on the base substrate BS covers the orthographic projection of the one or more first conductive lines CL1 in the flexible printed circuit portion FPCP on the base substrate BS.

In some embodiments, the orthographic projection of the first electromagnetic interference shielding layer EMI1 on the base substrate BS is at least partially non-overlapping with an orthographic projection of the one or more coil lines COL in the antenna portion ATP on the base substrate BS. Optionally, the orthographic projection of the first electromagnetic interference shielding layer EMI1 on the base substrate BS is completely non-overlapping with the orthographic projection of the one or more coil lines COL in the antenna portion ATP on the base substrate BS.

In alternative embodiments, the orthographic projection of the first electromagnetic interference shielding layer EMI1 on the base substrate BS at least partially overlaps with an orthographic projection of the one or more coil lines COL in the antenna portion ATP on the base substrate BS. Optionally, the orthographic projection of the first electromagnetic interference shielding layer EMI1 on the base substrate BS covers the orthographic projection of the one or more coil lines COL in the antenna portion ATP on the base substrate BS.

Various appropriate electromagnetic interference shielding materials and various appropriate fabricating methods may be used to make the first electromagnetic interference shielding layer EMI1. For example, an electromagnetic interference shielding material may be deposited on the substrate by magnetron sputtering, vapor deposition (e.g., plasma-enhanced chemical vapor deposition), or vacuum deposition. Examples of appropriate electromagnetic interference shielding materials for making the first electromagnetic interference shielding layer EMI1 include, but are not limited to, metals, alloys, carbons, ceramics, conductive polymers, and composites thereof.

In some embodiments, the circuit device further includes an adhesive layer AHL on a side of the first coverlay layer CVL1 away from the base substrate BS. Optionally, the adhesive layer AHL is on a side of the first coverlay layer CVL1 and the first electromagnetic interference shielding layer EMI1 away from the base substrate BS. The adhesive layer AHL is configured to adhere the circuit device to the display panel, e.g., to a back side of the display panel. Optionally, the adhesive layer AHL is a unitary structure extending from a region of the antenna portion ATP to a region of the flexible printed circuit portion FPCP.

Various appropriate materials and various appropriate fabricating methods may be used to make the adhesive layer AHL. Examples of appropriate pressure sensitive adhesive materials include, but are not limited to, an acrylate-based adhesive material (e.g., homopolymers and copolymers of acrylic acid, methacrylic acid, isooctyl acrylate, acrylamide, methacrylamide, acrylonitrile, methacrylonitrile, methyl isoamyl acrylate, 2-ethyl hexylacrylate, and butyl acrylate), polyacrylic-based adhesive material (e.g., polymethyl methacrylate (PMMA)), cyclic olefin copolymer, polycarbonate, epoxies, silicone-based adhesive materials, or a combination thereof.

In some embodiments, the first conductive layer CDL1, the first coverlay layer CVL1, the first electromagnetic interference shielding layer EMI1, and the adhesive layer AHL are on the first side S1 of the base substrate BS.

In some embodiments, the circuit device further includes a second conductive layer CDL2 on a second side S2 of the base substrate BS. Optionally, the second conductive layer CDL2 includes one or more second conductive lines CL2.

Optionally, the second conductive layer CDL2 is at least partially in the flexible printed circuit portion FPCP. Optionally, the second conductive layer CDL2 is at least partially absent in the antenna portion ATP. Optionally, the second conductive layer CDL2 is completely absent in the antenna portion ATP.

In some embodiments, an orthographic projection of the second conductive layer CDL2 on the base substrate BS at least partially overlaps with an orthographic projection of the one or more first conductive lines CL1 in the flexible printed circuit portion FPCP on the base substrate BS.

In some embodiments, the orthographic projection of the second conductive layer CDL2 on the base substrate BS is at least partially non-overlapping with an orthographic projection of the one or more coil lines COL in the antenna portion ATP on the base substrate BS. Optionally, the orthographic projection of the second conductive layer CDL2 on the base substrate BS is completely non-overlapping with the orthographic projection of the one or more coil lines COL in the antenna portion ATP on the base substrate BS.

Various appropriate conductive materials and various appropriate fabricating methods may be used to make the second conductive layer CDL2. For example, a conductive metal material may be deposited on the substrate by magnetron sputtering, vapor deposition (e.g., plasma-enhanced chemical vapor deposition), or vacuum deposition. Examples of appropriate conductive metal materials for making the second conductive layer CDL2 include, but are not limited to, copper, titanium, tantalum, aluminum, molybdenum, chromium, and various alloys or laminates thereof.

In some embodiments, the circuit device further includes a magnetic material layer MML on a second side S2 of the base substrate BS. Optionally, the magnetic material layer MML is configured to guide magnetic flux generated by the one or more coil lines COL. By having the magnetic material layer MML converging the magnetic flux generated by the one or more coil lines COL, the read/write capability of the antenna portion ATP can be greatly enhanced.

In some embodiments, an orthographic projection of the magnetic material layer MML on the base substrate BS at least partially overlaps with an orthographic projection of the one or more coil lines COL on the base substrate BS. Optionally, the orthographic projection of the magnetic material layer MML on the base substrate BS covers the orthographic projection of the one or more coil lines COL on the base substrate BS.

Various appropriate magnetic materials may be used to make the magnetic material layer MML. Examples of magnetic materials for making the magnetic material layer MML include ferrimagnetic materials. Examples of ferrimagnetic materials include ferrite. Examples of ferrites include $AO{\cdot}B_2O_3$, wherein A and B are two metal elements. Optionally, A and B are selected from a group consisting of Fe, Mn, Zn, Ni, Mg, Co, Cu, Ba, Sr, and so on. In one example, A and B are different from each other. In another example, A and B stand for a same metal element. Optionally, A is a mixture of two different metal elements such as Ni and Zn, or Mn and Zn. Additional examples of ferrites include Mn—Zn ferrite ($Mn_aZn_{(1-a)}BO_4$, optionally B is iron element) and Ni—Zn ferrite ($Ni_aZn_{(1-a)}BO_4$, optionally B is Iron element).

In some embodiments, the circuit device further includes a second coverlay layer CVL2 on a side of the second conductive layer CDL2 away from the base substrate BS. Various appropriate insulating materials and various appropriate fabricating methods may be used to make the second coverlay layer CVL2. In some embodiments, the second coverlay layer CVL2 includes a plurality of sub-layers. Optionally, the plurality of sub-layers include an insulating material sub-layer and an adhesive sub-layer. The adhesive sub-layer adheres the insulating material sub-layer to an adjacent layer (e.g., the second conductive layer CDL2).

In some embodiments, an orthographic projection of the second coverlay layer CVL2 on the base substrate BS at least partially overlaps with an orthographic projection of the first conductive layer CDL1 on the base substrate BS. Optionally, the orthographic projection of the second coverlay layer CVL2 on the base substrate BS covers the orthographic projection of the first conductive layer CDL1 on the base substrate BS.

In some embodiments, the circuit device further includes a second electromagnetic interference shielding layer EMI2 on a side of the second coverlay layer CVL2 away from the base substrate BS. The second electromagnetic interference shielding layer EMI2 is configured to shield the circuit device (e.g., the flexible printed circuit portion FPCP) from electromagnetic waves. For example, the second electromagnetic interference shielding layer EMI2 may be configured to shield the flexible printed circuit portion FPCP from electromagnetic waves generated during wireless charging of the display panel.

Optionally, the second electromagnetic interference shielding layer EMI2 is at least partially in the flexible printed circuit portion FPCP. Optionally, the second electromagnetic interference shielding layer EMI2 is at least partially absent in the antenna portion ATP. Optionally, the second electromagnetic interference shielding layer EMI2 is completely absent in the antenna portion ATP.

In some embodiments, an orthographic projection of the second electromagnetic interference shielding layer EMI2 on the base substrate BS at least partially overlaps with an orthographic projection of the one or more first conductive lines CL1 in the flexible printed circuit portion FPCP on the base substrate BS. Optionally, the orthographic projection of the second electromagnetic interference shielding layer EMI2 on the base substrate BS covers the orthographic projection of the one or more first conductive lines CL1 in the flexible printed circuit portion FPCP on the base substrate BS.

In some embodiments, the orthographic projection of the second electromagnetic interference shielding layer EMI2 on the base substrate BS is at least partially non-overlapping with an orthographic projection of the one or more coil lines COL in the antenna portion ATP on the base substrate BS. Optionally, the orthographic projection of the second electromagnetic interference shielding layer EMI2 on the base substrate BS is completely non-overlapping with the orthographic projection of the one or more coil lines COL in the antenna portion ATP on the base substrate BS.

In alternative embodiments, the orthographic projection of the second electromagnetic interference shielding layer EMI2 on the base substrate BS at least partially overlaps with an orthographic projection of the one or more coil lines COL in the antenna portion ATP on the base substrate BS. Optionally, the orthographic projection of the second electromagnetic interference shielding layer EMI2 on the base substrate BS covers the orthographic projection of the one or more coil lines COL in the antenna portion ATP on the base substrate BS.

Various appropriate electromagnetic interference shielding materials and various appropriate fabricating methods may be used to make the second electromagnetic interference shielding layer EMI2. For example, an electromagnetic interference shielding material may be deposited on the substrate by magnetron sputtering, vapor deposition (e.g., plasma-enhanced chemical vapor deposition), or vacuum deposition. Examples of appropriate electromagnetic interference shielding materials for making the second electromagnetic interference shielding layer EMI2 include, but are not limited to, metals, alloys, carbons, ceramics, conductive polymers, and composites thereof.

In some embodiments, the magnetic material layer MML, the second conductive layer CDL2, the second coverlay layer CVL2, and the second electromagnetic interference shielding layer EMI2 are on the second side S2 of the base substrate BS.

FIG. 2C illustrates the layout of one or more coil lines and one or more first conductive lines in some embodiments according to the present disclosure. In some embodiments, the one or more coil lines COL has a first average line width w1 in a range of 0.08 mm to 1.20 mm, e.g., 0.08 mm to 0.40 mm, 0.40 mm to 0.80 mm, and 0.80 mm to 1.20 mm. Optionally, coil lines of the one or more coil lines COL are spaced apart by a first average distance d1 in a range of 0.10 mm to 0.30 mm, e.g., 0.10 mm to 0.15 mm, 0.15 mm to 0.20 mm, 0.20 mm to 0.25 mm, or 0.25 mm to 0.30 mm.

In some embodiments, the one or more first conductive lines CL1 has a second average line width w2 in a range of 0.05 mm to 0.20 mm, e.g., 0.05 mm to 0.10 mm, 0.10 mm to 0.15 mm, and 0.15 mm to 0.20 mm. Optionally, first conductive lines of the one or more first conductive lines CL1 are spaced apart by a second average distance d2 in a range of 0.05 mm to 0.08 mm, e.g., 0.05 mm to 0.06 mm, 0.06 mm to 0.07 mm, or 0.07 mm to 0.08 mm.

In some embodiments, the first average line width w1 is greater than the second average line width w2. In some embodiments, the first average distance d1 is greater than the second average distance d2.

In some embodiments, the one or more coil lines COL is spaced apart from a closest edge of the base substrate BS by an average distance in a range of 0.10 mm to 0.20 mm, e.g., 0.10 mm to 0.15 mm or 0.15 mm to 0.20 mm.

In some embodiments, the base substrate BS has an average thickness of 15 μm to 30 μm, e.g., 15 μm to 20 μm, 20 μm to 25 μm, or 25 μm to 30 μm. In some embodiments, the first coverlay layer CVL1 or the second coverlay layer CVL2 has an average thickness of 10 μm to 20 μm, e.g., 10 μm to 15 μm or 15 μm to 20 μm. In some embodiments, the first electromagnetic interference shielding layer or the second electromagnetic interference shielding layer has an average thickness of 5 μm to 15 μm, e.g., 5 μm to 10 μm or 10 μm to 15 μm. In some embodiments, the adhesive layer AHL has an average thickness of 40 μm to 60 μm, e.g., 40 μm to 50 μm or 50 μm to 60 μm. In some embodiments, the magnetic material layer MML has an average thickness of 50 μm to 70 μm, e.g., 50 μm to 60 μm or 60 μm to 70 μm.

Figure 3:
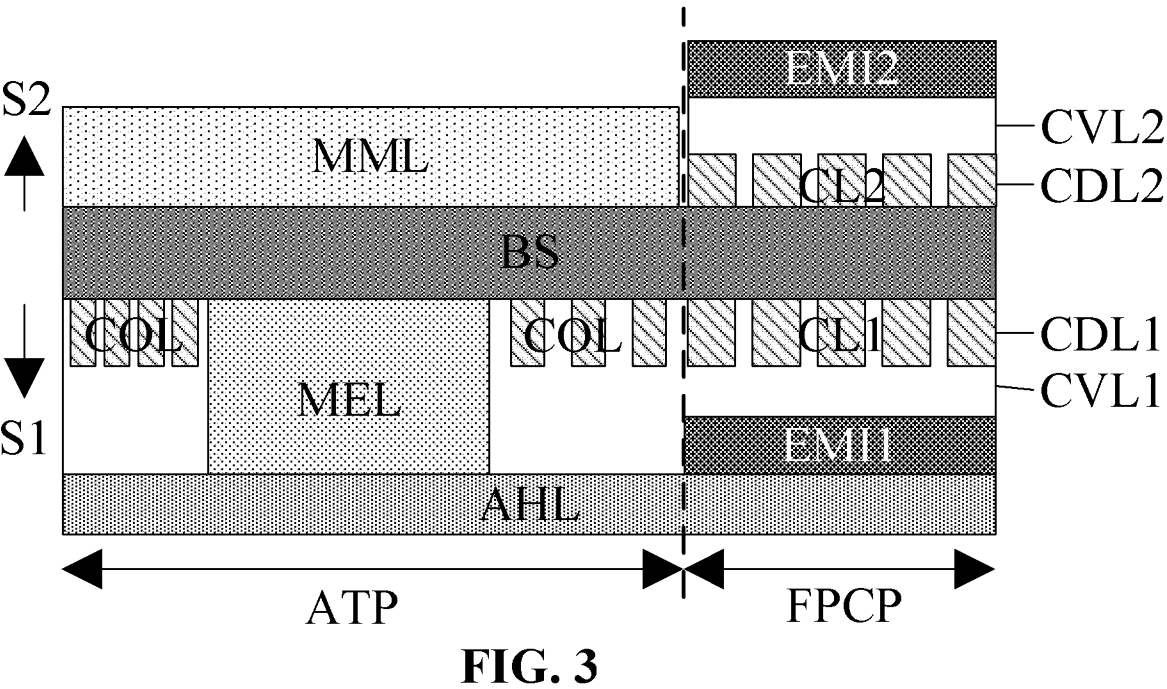
FIG. 3 is a cross-sectional view of a circuit device in some embodiments according to the present disclosure.

FIG. 3 is a cross-sectional view of a circuit device in some embodiments according to the present disclosure. For example, FIG. 3 may be a cross-sectional view along an A-A' line in FIG. 1. Referring to FIG. 1 and FIG. 3, the circuit device in some embodiments includes a base substrate BS, a first conductive layer CDL1 on a first side S1 of the base substrate BS, a first coverlay layer CVL1 on a side of the first conductive layer CDL1 away from the base substrate BS. The base substrate BS is a unitary structure extending from a region of the antenna portion ATP to a region of the flexible printed circuit portion FPCP. Optionally, the first coverlay layer CVL1 is a unitary structure extending from a region of the antenna portion ATP to a region of the flexible printed circuit portion FPCP.

In some embodiments, the first conductive layer CDL1 includes one or more coil lines COL in the antenna portion ATP and one or more first conductive lines CL1 in the flexible printed circuit portion FPCP. The one or more coil lines COL in the antenna portion ATP and the one or more first conductive lines CL1 in the flexible printed circuit portion FPCP are in a same layer. The inventors of the present disclosure discover that, by having the one or more coil lines COL in the antenna portion ATP and the one or more first conductive lines CL1 in the flexible printed circuit portion FPCP in a same layer, the effect of the magnetic field generated by the one or more coil lines COL in the antenna portion ATP on the flexible printed circuit portion FPCP can be reduced or minimized.

Referring to FIG. 1 and FIG. 3, the circuit device in some embodiments further includes a magnetic field enhancing layer MEL on the first side S1 of the base substrate BS. The magnetic field enhancing layer MEL is configured to enhance a magnetic field generated by the one or more coil lines COL of the antenna part ATP. In some embodiments, the one or more coil lines COL substantially surrounds the magnetic field enhancing layer MEL. the one or more coil lines COL in the antenna portion ATP have a plurality of turns for generating inductance. The plurality of turns substantially surround the magnetic field enhancing layer MEL.

In some embodiments, an orthographic projection of the first coverlay layer CVL1 on the base substrate BS at least partially overlaps with an orthographic projection of the first conductive layer CDL1 on the base substrate BS. Optionally, the orthographic projection of the first coverlay layer CVL1 on the base substrate BS covers the orthographic projection of the first conductive layer CDL1 on the base substrate BS.

In some embodiments, the circuit device further includes a first electromagnetic interference shielding layer EMI1 on a side of the first coverlay layer CVL1 away from the base substrate BS. The first electromagnetic interference shielding layer EMI1 is configured to shield the circuit device (e.g., the flexible printed circuit portion FPCP) from electromagnetic waves. For example, the first electromagnetic interference shielding layer EMI1 may be configured to shield the flexible printed circuit portion FPCP from electromagnetic waves generated during wireless charging of the display panel.

Optionally, the first electromagnetic interference shielding layer EMI1 is at least partially in the flexible printed circuit portion FPCP. Optionally, the first electromagnetic interference shielding layer EMI1 is at least partially absent in the antenna portion ATP. Optionally, the first electromagnetic interference shielding layer EMI1 is completely absent in the antenna portion ATP.

In some embodiments, an orthographic projection of the first electromagnetic interference shielding layer EMI1 on the base substrate BS at least partially overlaps with an orthographic projection of the one or more first conductive lines CL1 in the flexible printed circuit portion FPCP on the base substrate BS. Optionally, the orthographic projection of the first electromagnetic interference shielding layer EMI1 on the base substrate BS covers the orthographic projection of the one or more first conductive lines CL1 in the flexible printed circuit portion FPCP on the base substrate BS.

In some embodiments, the orthographic projection of the first electromagnetic interference shielding layer EMI1 on the base substrate BS is at least partially non-overlapping with an orthographic projection of the one or more coil lines COL in the antenna portion ATP on the base substrate BS. Optionally, the orthographic projection of the first electromagnetic interference shielding layer EMI1 on the base substrate BS is completely non-overlapping with the orthographic projection of the one or more coil lines COL in the antenna portion ATP on the base substrate BS.

In alternative embodiments, the orthographic projection of the first electromagnetic interference shielding layer EMI1 on the base substrate BS at least partially overlaps with an orthographic projection of the one or more coil lines COL in the antenna portion ATP on the base substrate BS. Optionally, the orthographic projection of the first electromagnetic interference shielding layer EMI1 on the base substrate BS covers the orthographic projection of the one or more coil lines COL in the antenna portion ATP on the base substrate BS.

In some embodiments, the circuit device further includes an adhesive layer AHL on a side of the first coverlay layer CVL1 away from the base substrate BS. Optionally, the adhesive layer AHL is on a side of the first coverlay layer CVL1 and the first electromagnetic interference shielding layer EMI1 away from the base substrate BS. The adhesive layer AHL is configured to adhere the circuit device to the display panel, e.g., to a back side of the display panel. Optionally, the adhesive layer AHL is a unitary structure extending from a region of the antenna portion ATP to a region of the flexible printed circuit portion FPCP.

In some embodiments, the first conductive layer CDL1, the first coverlay layer CVL1, the first electromagnetic interference shielding layer EMI1, and the adhesive layer AHL are on the first side S1 of the base substrate BS.

In some embodiments, the magnetic field enhancing layer MEL is in direct contact with the base substrate BS on one side, and in direct contact with the adhesive layer AHL on the other side.

In some embodiments, the circuit device further includes a second conductive layer CDL2 on a second side S2 of the base substrate BS. Optionally, the second conductive layer CDL2 includes one or more second conductive lines CL2.

Optionally, the second conductive layer CDL2 is at least partially in the flexible printed circuit portion FPCP. Optionally, the second conductive layer CDL2 is at least partially absent in the antenna portion ATP. Optionally, the second conductive layer CDL2 is completely absent in the antenna portion ATP.

In some embodiments, an orthographic projection of the second conductive layer CDL2 on the base substrate BS at least partially overlaps with an orthographic projection of the one or more first conductive lines CL1 in the flexible printed circuit portion FPCP on the base substrate BS.

In some embodiments, the orthographic projection of the second conductive layer CDL2 on the base substrate BS is at least partially non-overlapping with an orthographic projection of the one or more coil lines COL in the antenna portion ATP on the base substrate BS. Optionally, the orthographic projection of the second conductive layer CDL2 on the base substrate BS is completely non-overlapping with the orthographic projection of the one or more coil lines COL in the antenna portion ATP on the base substrate BS.

In some embodiments, the circuit device further includes a magnetic material layer MML on a second side S2 of the base substrate BS. Optionally, the magnetic material layer MML is configured to guide magnetic flux generated by the one or more coil lines COL. By having the magnetic material layer MML converging the magnetic flux generated by the one or more coil lines COL, the read/write capability of the antenna portion ATP can be greatly enhanced.

In some embodiments, an orthographic projection of the magnetic material layer MML on the base substrate BS at least partially overlaps with an orthographic projection of the one or more coil lines COL on the base substrate BS. Optionally, the orthographic projection of the magnetic material layer MML on the base substrate BS covers the orthographic projection of the one or more coil lines COL on the base substrate BS.

In some embodiments, an orthographic projection of the magnetic material layer MML on the base substrate BS at least partially overlaps with an orthographic projection of the magnetic field enhancing layer MEL on the base substrate BS. Optionally, the orthographic projection of the magnetic material layer MML on the base substrate BS covers the orthographic projection of the magnetic field enhancing layer MEL on the base substrate BS.

In some embodiments, the circuit device further includes a second coverlay layer CVL2 on a side of the second conductive layer CDL2 away from the base substrate BS. Various appropriate insulating materials and various appropriate fabricating methods may be used to make the second coverlay layer CVL2. In some embodiments, the second coverlay layer CVL2 includes a plurality of sub-layers. Optionally, the plurality of sub-layers include an insulating material sub-layer and an adhesive sub-layer. The adhesive sub-layer adheres the insulating material sub-layer to an adjacent layer (e.g., the second conductive layer CDL2).

In some embodiments, an orthographic projection of the second coverlay layer CVL2 on the base substrate BS at least partially overlaps with an orthographic projection of the first conductive layer CDL1 on the base substrate BS. Optionally, the orthographic projection of the second coverlay layer CVL2 on the base substrate BS covers the orthographic projection of the first conductive layer CDL1 on the base substrate BS.

In some embodiments, the circuit device further includes a second electromagnetic interference shielding layer EMI2 on a side of the second coverlay layer CVL2 away from the base substrate BS. The second electromagnetic interference shielding layer EMI2 is configured to shield the circuit device (e.g., the flexible printed circuit portion FPCP) from electromagnetic waves. For example, the second electromagnetic interference shielding layer EMI2 may be configured to shield the flexible printed circuit portion FPCP from electromagnetic waves generated during wireless charging of the display panel.

Optionally, the second electromagnetic interference shielding layer EMI2 is at least partially in the flexible printed circuit portion FPCP. Optionally, the second electromagnetic interference shielding layer EMI2 is at least partially absent in the antenna portion ATP. Optionally, the second electromagnetic interference shielding layer EMI2 is completely absent in the antenna portion ATP.

In some embodiments, an orthographic projection of the second electromagnetic interference shielding layer EMI2 on the base substrate BS at least partially overlaps with an orthographic projection of the one or more first conductive lines CL1 in the flexible printed circuit portion FPCP on the base substrate BS. Optionally, the orthographic projection of the second electromagnetic interference shielding layer EMI2 on the base substrate BS covers the orthographic projection of the one or more first conductive lines CL1 in the flexible printed circuit portion FPCP on the base substrate BS.

In some embodiments, the orthographic projection of the second electromagnetic interference shielding layer EMI2 on the base substrate BS is at least partially non-overlapping with an orthographic projection of the one or more coil lines COL in the antenna portion ATP on the base substrate BS. Optionally, the orthographic projection of the second electromagnetic interference shielding layer EMI2 on the base substrate BS is completely non-overlapping with the orthographic projection of the one or more coil lines COL in the antenna portion ATP on the base substrate BS.

In alternative embodiments, the orthographic projection of the second electromagnetic interference shielding layer EMI2 on the base substrate BS at least partially overlaps with an orthographic projection of the one or more coil lines COL in the antenna portion ATP on the base substrate BS. Optionally, the orthographic projection of the second electromagnetic interference shielding layer EMI2 on the base substrate BS covers the orthographic projection of the one or more coil lines COL in the antenna portion ATP on the base substrate BS.

In some embodiments, the magnetic material layer MML, the second conductive layer CDL2, the second coverlay layer CVL2, and the second electromagnetic interference shielding layer EMI2 are on the second side S2 of the base substrate BS.

In some embodiments, the one or more coil lines COL has a first average line width in a range of 0.08 mm to 1.20 mm, e.g., 0.08 mm to 0.40 mm, 0.40 mm to 0.80 mm, and 0.80 mm to 1.20 mm. Optionally, coil lines of the one or more coil lines COL are spaced apart by a first average distance in a range of 0.10 mm to 0.30 mm, e.g., 0.10 mm to 0.15 mm, 0.15 mm to 0.20 mm, 0.20 mm to 0.25 mm, or 0.25 mm to 0.30 mm.

In some embodiments, the one or more first conductive lines CL1 has a second average line width in a range of 0.05 mm to 0.20 mm, e.g., 0.05 mm to 0.10 mm, 0.10 mm to 0.15 mm, and 0.15 mm to 0.20 mm. Optionally, first conductive lines of the one or more first conductive lines CL1 are spaced apart by a second average distance in a range of 0.05 mm to 0.08 mm, e.g., 0.05 mm to 0.06 mm, 0.06 mm to 0.07 mm, or 0.07 mm to 0.08 mm.

In some embodiments, the first average line width is greater than the second average line width. In some embodiments, the first average distance is greater than the second average distance.

In some embodiments, the one or more coil lines COL is spaced apart from a closest edge of the base substrate BS by an average distance in a range of 0.10 mm to 0.20 mm, e.g., 0.10 mm to 0.15 mm or 0.15 mm to 0.20 mm.

In some embodiments, the base substrate BS has an average thickness of 15 μm to 30 μm, e.g., 15 μm to 20 μm, 20 μm to 25 μm, or 25 μm to 30 μm. In some embodiments, the first coverlay layer CVL1 or the second coverlay layer CVL2 has an average thickness of 10 μm to 20 μm, e.g., 10 μm to 15 μm or 15 μm to 20 μm. In some embodiments, the first electromagnetic interference shielding layer EMI1 or the second electromagnetic interference shielding layer EMI2 has an average thickness of 5 μm to 15 μm, e.g., 5 μm to 10 μm or 10 μm to 15 μm. In some embodiments, the adhesive layer AHL has an average thickness of 40 μm to 60 μm, e.g., 40 μm to 50 μm or 50 μm to 60 μm. In some embodiments, the magnetic field enhancing layer MEL has an average thickness of 20 μm to 45 μm, e.g., 20 μm to 25 μm, 25 μm to 30 μm, 30 μm to 35 μm, 35 μm to 40 μm, or 40 μm to 45 μm. In some embodiments, the magnetic material layer MML has an average thickness of 50 μm to 70 μm, e.g., 50 μm to 60 μm or 60 μm to 70 μm.

Various appropriate magnetic field enhancing materials may be used for making the magnetic field enhancing layer MEL. Examples of appropriate magnetic field enhancing materials include various magnetic permeable materials such as various metals and various alloys. Specific examples of magnetic field enhancing materials include stainless steel, iron, silicon steel, various ferrite materials, various permalloys such as iron-aluminum alloys, iron-nickel alloys, iron-cobalt alloys, neodymium-iron-boron alloys.

In one example, the circuit device does not include a magnetic field enhancing layer MEL (see, e.g., FIG. 2A and FIG. 2B), and the magnetic field generated by the one or more coil lines COL is 3.45 A/m. In another example, the circuit device includes a magnetic field enhancing layer MEL (see, e.g., FIG. 3), the magnetic field enhancing layer MEL includes stainless steel, and the magnetic field generated by the one or more coil lines COL is enhanced to 8.51 A/m. In another example, the circuit device includes a magnetic field enhancing layer MEL (see, e.g., FIG. 3), the magnetic field enhancing layer MEL includes iron, and the magnetic field generated by the one or more coil lines COL is enhanced to 6.86 A/m. In another example, the circuit device includes a magnetic field enhancing layer MEL (see, e.g., FIG. 3), the magnetic field enhancing layer MEL includes iron-aluminum alloy, and the magnetic field generated by the one or more coil lines COL is enhanced to 7.84 A/m.

Figure 4:
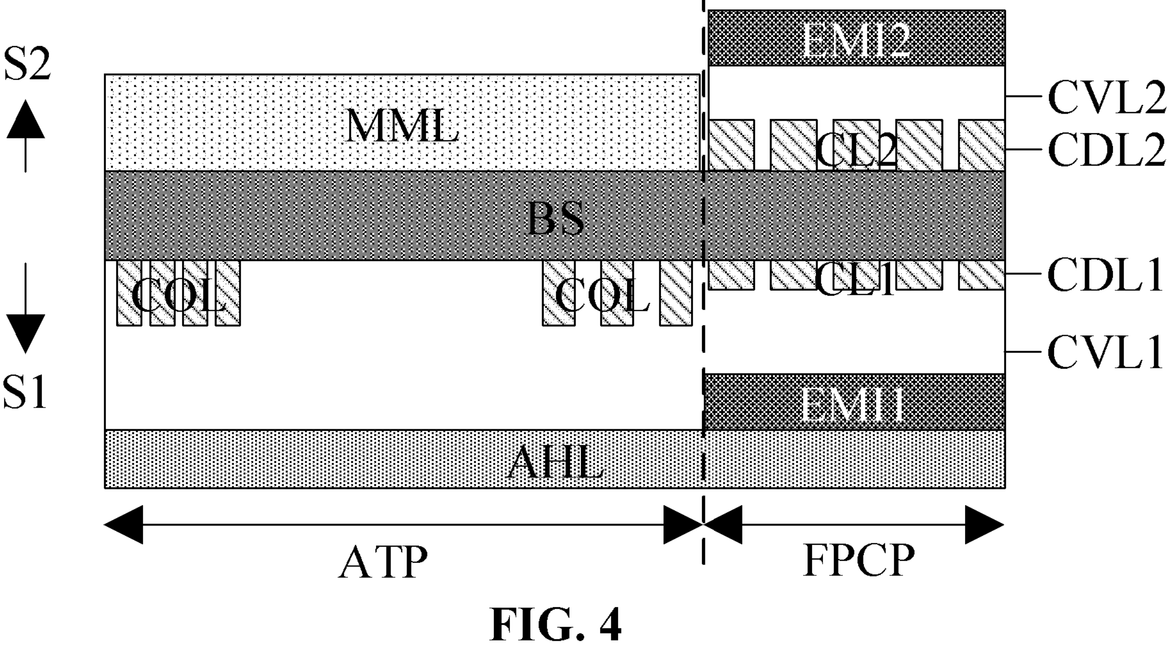
FIG. 4 is a cross-sectional view of a circuit device in some embodiments according to the present disclosure.
Figure 5:
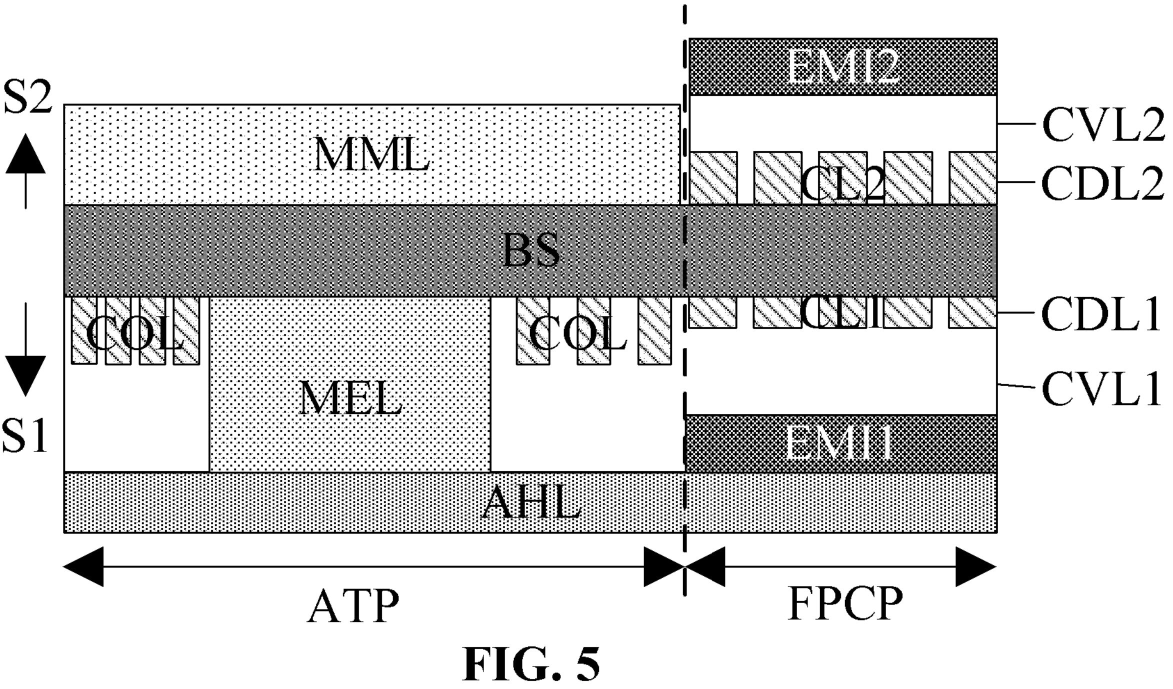
FIG. 5 is a cross-sectional view of a circuit device in some embodiments according to the present disclosure.

FIG. 4 is a cross-sectional view of a circuit device in some embodiments according to the present disclosure. The circuit device depicted in FIG. 4 differs from the circuit device depicted in FIG. 2A in that the one or more coil lines COL has a thickness different from a thickness of the one or more first conductive lines CL1. FIG. 5 is a cross-sectional view of a circuit device in some embodiments according to the present disclosure. The circuit device depicted in FIG. 5 differs from the circuit device depicted in FIG. 3 in that the one or more coil lines COL has a thickness different from a thickness of the one or more first conductive lines CL1.

Referring to FIG. 4 and FIG. 5, in some embodiments, the one or more coil lines COL has a first thickness greater than a second thickness of the one or more first conductive lines CL, e.g., by at least 10%, by at least 20%, by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, or by at least 200%.

In alternative embodiments, the one or more first conductive lines CL1 has a second thickness greater than a first thickness of the one or more coil lines COL, e.g., by at least 10%, by at least 20%, by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, or by at least 200%.

Figure 6:
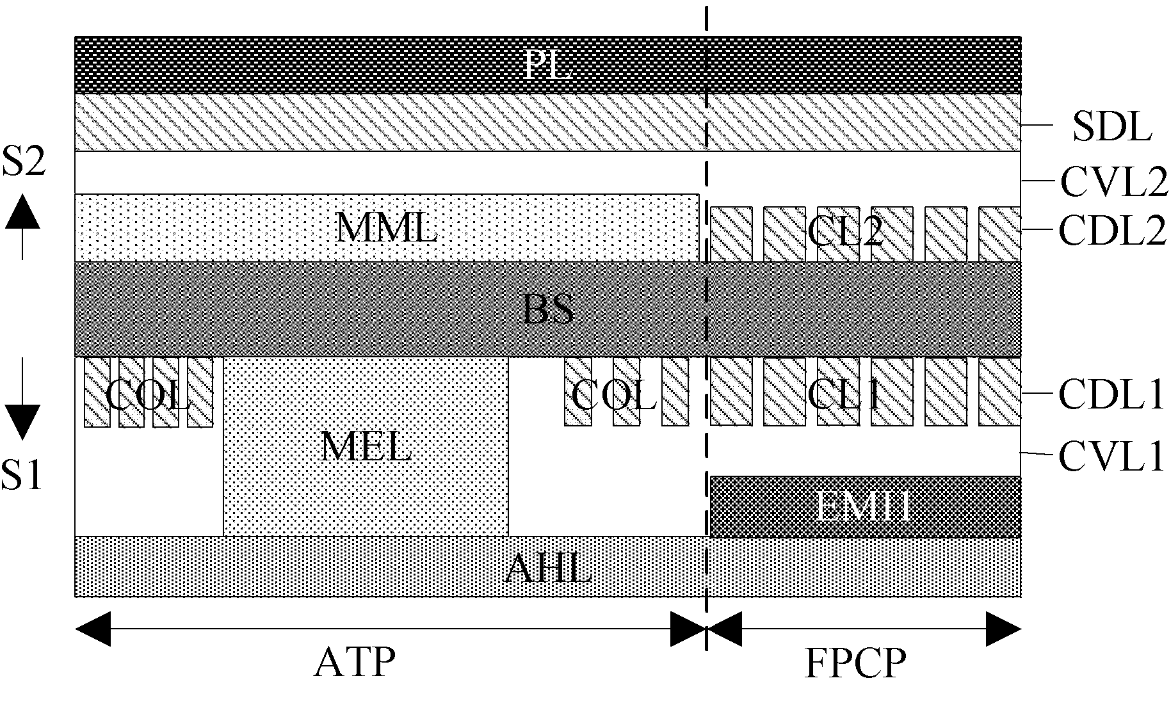
FIG. 6 is a cross-sectional view of a circuit device in some embodiments according to the present disclosure.

FIG. 6 is a cross-sectional view of a circuit device in some embodiments according to the present disclosure. For example, FIG. 6 may be a cross-sectional view along an A-A' line in FIG. 1. Referring to FIG. 1 and FIG. 6, the circuit device in some embodiments includes a base substrate BS, a first conductive layer CDL1 on a first side S1 of the base substrate BS, a first coverlay layer CVL1 on a side of the first conductive layer CDL1 away from the base substrate BS. The base substrate BS is a unitary structure extending from a region of the antenna portion ATP to a region of the flexible printed circuit portion FPCP. Optionally, the first coverlay layer CVL1 is a unitary structure extending from a region of the antenna portion ATP to a region of the flexible printed circuit portion FPCP.

In some embodiments, the first conductive layer CDL1 includes one or more coil lines COL in the antenna portion ATP and one or more first conductive lines CL1 in the flexible printed circuit portion FPCP. The one or more coil lines COL in the antenna portion ATP and the one or more first conductive lines CL1 in the flexible printed circuit portion FPCP are in a same layer. The inventors of the present disclosure discover that, by having the one or more coil lines COL in the antenna portion ATP and the one or more first conductive lines CL1 in the flexible printed circuit portion FPCP in a same layer, the effect of the magnetic field generated by the one or more coil lines COL in the antenna portion ATP on the flexible printed circuit portion FPCP can be reduced or minimized.

Referring to FIG. 1 and FIG. 6, the circuit device in some embodiments further includes a magnetic field enhancing layer MEL on the first side S1 of the base substrate BS. The magnetic field enhancing layer MEL is configured to enhance a magnetic field generated by the one or more coil lines COL of the antenna part ATP. In some embodiments, the one or more coil lines COL substantially surrounds the magnetic field enhancing layer MEL. The one or more coil lines COL in the antenna portion ATP have a plurality of turns for generating inductance. The plurality of turns substantially surround the magnetic field enhancing layer MEL.

In some embodiments, an orthographic projection of the first coverlay layer CVL1 on the base substrate BS at least partially overlaps with an orthographic projection of the first conductive layer CDL1 on the base substrate BS. Optionally, the orthographic projection of the first coverlay layer CVL1 on the base substrate BS covers the orthographic projection of the first conductive layer CDL1 on the base substrate BS.

In some embodiments, the circuit device further includes a first electromagnetic interference shielding layer EMI1 on a side of the first coverlay layer CVL1 away from the base substrate BS. The first electromagnetic interference shielding layer EMI1 is configured to shield the circuit device (e.g., the flexible printed circuit portion FPCP) from electromagnetic waves. For example, the first electromagnetic interference shielding layer EMI1 may be configured to shield the flexible printed circuit portion FPCP from electromagnetic waves generated during wireless charging of the display panel.

Optionally, the first electromagnetic interference shielding layer EMI1 is at least partially in the flexible printed circuit portion FPCP. Optionally, the first electromagnetic interference shielding layer EMI1 is at least partially absent in the antenna portion ATP. Optionally, the first electromagnetic interference shielding layer EMI1 is completely absent in the antenna portion ATP.

In some embodiments, an orthographic projection of the first electromagnetic interference shielding layer EMI1 on the base substrate BS at least partially overlaps with an orthographic projection of the one or more first conductive lines CL1 in the flexible printed circuit portion FPCP on the base substrate BS. Optionally, the orthographic projection of the first electromagnetic interference shielding layer EMI1 on the base substrate BS covers the orthographic projection of the one or more first conductive lines CL1 in the flexible printed circuit portion FPCP on the base substrate BS.

In some embodiments, the orthographic projection of the first electromagnetic interference shielding layer EMI1 on the base substrate BS is at least partially non-overlapping with an orthographic projection of the one or more coil lines COL in the antenna portion ATP on the base substrate BS. Optionally, the orthographic projection of the first electromagnetic interference shielding layer EMI1 on the base substrate BS is completely non-overlapping with the orthographic projection of the one or more coil lines COL in the antenna portion ATP on the base substrate BS.

In alternative embodiments, the orthographic projection of the first electromagnetic interference shielding layer EMI1 on the base substrate BS at least partially overlaps with an orthographic projection of the one or more coil lines COL in the antenna portion ATP on the base substrate BS. Optionally, the orthographic projection of the first electromagnetic interference shielding layer EMI1 on the base substrate BS covers the orthographic projection of the one or more coil lines COL in the antenna portion ATP on the base substrate BS.

In some embodiments, the circuit device further includes an adhesive layer AHL on a side of the first coverlay layer CVL1 away from the base substrate BS. Optionally, the adhesive layer AHL is on a side of the first coverlay layer CVL1 and the first electromagnetic interference shielding layer EMI1 away from the base substrate BS. The adhesive layer AHL is configured to adhere the circuit device to the display panel, e.g., to a back side of the display panel. Optionally, the adhesive layer AHL is a unitary structure extending from a region of the antenna portion ATP to a region of the flexible printed circuit portion FPCP.

In some embodiments, the first conductive layer CDL1, the first coverlay layer CVL1, the first electromagnetic interference shielding layer EMI1, and the adhesive layer AHL are on the first side S1 of the base substrate BS.

In some embodiments, the magnetic field enhancing layer MEL is in direct contact with the base substrate BS on one side, and in direct contact with the adhesive layer AHL on the other side.

In some embodiments, the circuit device further includes a second conductive layer CDL2 on a second side S2 of the base substrate BS. Optionally, the second conductive layer CDL2 includes one or more second conductive lines CL2.

Optionally, the second conductive layer CDL2 is at least partially in the flexible printed circuit portion FPCP. Optionally, the second conductive layer CDL2 is at least partially absent in the antenna portion ATP. Optionally, the second conductive layer CDL2 is completely absent in the antenna portion ATP.

In some embodiments, an orthographic projection of the second conductive layer CDL2 on the base substrate BS at least partially overlaps with an orthographic projection of the one or more first conductive lines CL1 in the flexible printed circuit portion FPCP on the base substrate BS.

In some embodiments, the orthographic projection of the second conductive layer CDL2 on the base substrate BS is at least partially non-overlapping with an orthographic projection of the one or more coil lines COL in the antenna portion ATP on the base substrate BS. Optionally, the orthographic projection of the second conductive layer CDL2 on the base substrate BS is completely non-overlapping with the orthographic projection of the one or more coil lines COL in the antenna portion ATP on the base substrate BS.

In some embodiments, the circuit device further includes a magnetic material layer MML on a second side S2 of the base substrate BS. Optionally, the magnetic material layer MML is configured to guide magnetic flux generated by the one or more coil lines COL. By having the magnetic material layer MML converging the magnetic flux generated by the one or more coil lines COL, the read/write capability of the antenna portion ATP can be greatly enhanced.

In some embodiments, an orthographic projection of the magnetic material layer MML on the base substrate BS at least partially overlaps with an orthographic projection of the one or more coil lines COL on the base substrate BS. Optionally, the orthographic projection of the magnetic material layer MML on the base substrate BS covers the orthographic projection of the one or more coil lines COL on the base substrate BS.

In some embodiments, an orthographic projection of the magnetic material layer MML on the base substrate BS at least partially overlaps with an orthographic projection of the magnetic field enhancing layer MEL on the base substrate BS. Optionally, the orthographic projection of the magnetic material layer MML on the base substrate BS covers the orthographic projection of the magnetic field enhancing layer MEL on the base substrate BS.

In some embodiments, the circuit device further includes a second coverlay layer CVL2 on a side of the second conductive layer CDL2 and the magnetic material layer MML away from the base substrate BS. The second coverlay layer CVL2 is a unitary structure extending from a region of the antenna portion ATP to a region of the flexible printed circuit portion FPCP. In some embodiments, the second coverlay layer CVL2 includes a plurality of sub-layers. Optionally, the plurality of sub-layers include an insulating material sub-layer and an adhesive sub-layer. The adhesive sub-layer adheres the insulating material sub-layer to an adjacent layer (e.g., the second conductive layer CDL2 or the magnetic material layer MML).

In some embodiments, an orthographic projection of the second coverlay layer CVL2 on the base substrate BS at least partially overlaps with an orthographic projection of the first conductive layer CDL1 on the base substrate BS. Optionally, the orthographic projection of the second coverlay layer CVL2 on the base substrate BS covers the orthographic projection of the first conductive layer CDL1 on the base substrate BS.

In some embodiments, the orthographic projection of the second coverlay layer CVL2 on the base substrate BS at least partially overlaps with an orthographic projection of the second conductive layer CDL2 on the base substrate BS, and at least partially overlaps with an orthographic projection of the magnetic material layer MML on the base substrate BS. Optionally, the orthographic projection of the second coverlay layer CVL2 on the base substrate BS covers the orthographic projection of the second conductive layer CDL2 on the base substrate BS, and covers the orthographic projection of the magnetic material layer MML on the base substrate BS.

In some embodiments, the circuit device further includes a shielding layer SDL on a side of the second coverlay layer CVL2 away from the base substrate BS. The shielding layer SDL is configured to shield the circuit device (e.g., the flexible printed circuit portion FPCP) from electromagnetic waves. For example, the shielding layer SDL may be configured to shield the flexible printed circuit portion FPCP from electromagnetic waves generated during wireless charging of the display panel.

Optionally, the shielding layer SDL is at least partially in the flexible printed circuit portion FPCP, and at least partially in the antenna portion ATP.

In some embodiments, an orthographic projection of the shielding layer SDL on the base substrate BS at least partially overlaps with an orthographic projection of the one or more first conductive lines CL1 in the flexible printed circuit portion FPCP on the base substrate BS. Optionally, the orthographic projection of the shielding layer SDL on the base substrate BS covers the orthographic projection of the one or more first conductive lines CL1 in the flexible printed circuit portion FPCP on the base substrate BS.

In some embodiments, the orthographic projection of the shielding layer SDL on the base substrate BS at least partially overlaps with an orthographic projection of the one or more coil lines COL in the antenna portion ATP on the base substrate BS. Optionally, the orthographic projection of the shielding layer SDL on the base substrate BS covers the orthographic projection of the one or more coil lines COL in the antenna portion ATP on the base substrate BS.

In some embodiments, the orthographic projection of the shielding layer SDL on the base substrate BS covers the orthographic projection of the one or more first conductive lines CL1 in the flexible printed circuit portion FPCP on the base substrate BS, and covers the orthographic projection of the one or more coil lines COL in the antenna portion ATP on the base substrate BS.

In some embodiments, the circuit device further includes a protective layer PL on a side of the shielding layer SDL away from the base substrate BS2. In one example, the protective layer PL is an ink material layer.

The inventors of the present disclosure discover that, by having the shielding layer SDL and the protective layer PL, the issue of water ripple pattern on the display panel when the display panel is charged wirelessly can be reduced or eliminated.

In some embodiments, the magnetic material layer MML, the second conductive layer CDL2, the second coverlay layer CVL2, the shielding layer SDL, and the protective layer PL are on the second side S2 of the base substrate BS.

In some embodiments, the one or more coil lines COL has a first average line width in a range of 0.08 mm to 1.20 mm, e.g., 0.08 mm to 0.40 mm, 0.40 mm to 0.80 mm, and 0.80 mm to 1.20 mm. Optionally, coil lines of the one or more coil lines COL are spaced apart by a first average distance in a range of 0.10 mm to 0.30 mm, e.g., 0.10 mm to 0.15 mm, 0.15 mm to 0.20 mm, 0.20 mm to 0.25 mm, or 0.25 mm to 0.30 mm.

In some embodiments, the one or more first conductive lines CL1 has a second average line width in a range of 0.05 mm to 0.20 mm, e.g., 0.05 mm to 0.10 mm, 0.10 mm to 0.15 mm, and 0.15 mm to 0.20 mm. Optionally, first conductive lines of the one or more first conductive lines CL1 are spaced apart by a second average distance in a range of 0.05 mm to 0.08 mm, e.g., 0.05 mm to 0.06 mm, 0.06 mm to 0.07 mm, or 0.07 mm to 0.08 mm.

In some embodiments, the first average line width is greater than the second average line width. In some embodiments, the first average distance is greater than the second average distance.

In some embodiments, the one or more coil lines COL is spaced apart from a closest edge of the base substrate BS by an average distance in a range of 0.10 mm to 0.20 mm, e.g., 0.10 mm to 0.15 mm or 0.15 mm to 0.20 mm.

In some embodiments, the base substrate BS has an average thickness of 15 μm to 30 μm, e.g., 15 μm to 20 μm, 20 μm to 25 μm, or 25 μm to 30 μm. In some embodiments, the first coverlay layer CVL1 or the second coverlay layer CVL2 has an average thickness of 10 μm to 20 μm, e.g., 10 μm to 15 μm or 15 μm to 20 μm. In some embodiments, the first electromagnetic interference shielding layer EMI1 has an average thickness of 5 μm to 15 μm, e.g., 5 μm to 10 μm or 10 μm to 15 μm. In some embodiments, the adhesive layer AHL has an average thickness of 40 μm to 60 μm, e.g., 40 μm to 50 μm or 50 μm to 60 μm. In some embodiments, the magnetic field enhancing layer MEL has an average thickness of 20 μm to 45 μm, e.g., 20 μm to 25 μm, 25 μm to 30 μm, 30 μm to 35 μm, 35 μm to 40 μm, or 40 μm to 45 μm. In some embodiments, the magnetic material layer MML has an average thickness of 50 μm to 70 μm, e.g., 50 μm to 60 μm or 60 μm to 70 μm. In some embodiments, the shielding layer SDL has an average thickness of 50 μm to 100 μm, e.g., 50 μm to 60 μm, 60 μm to 70 μm, 70 μm to 80 μm, 80 μm to 90 μm, or 90 μm to 100 μm. In some embodiments, the protective layer PL has an average thickness of 50 μm to 100 μm, e.g., 50 μm to 60 μm, 60 μm to 70 μm, 70 μm to 80 μm, 80 μm to 90 μm, or 90 μm to 100 μm.

Figure 7:
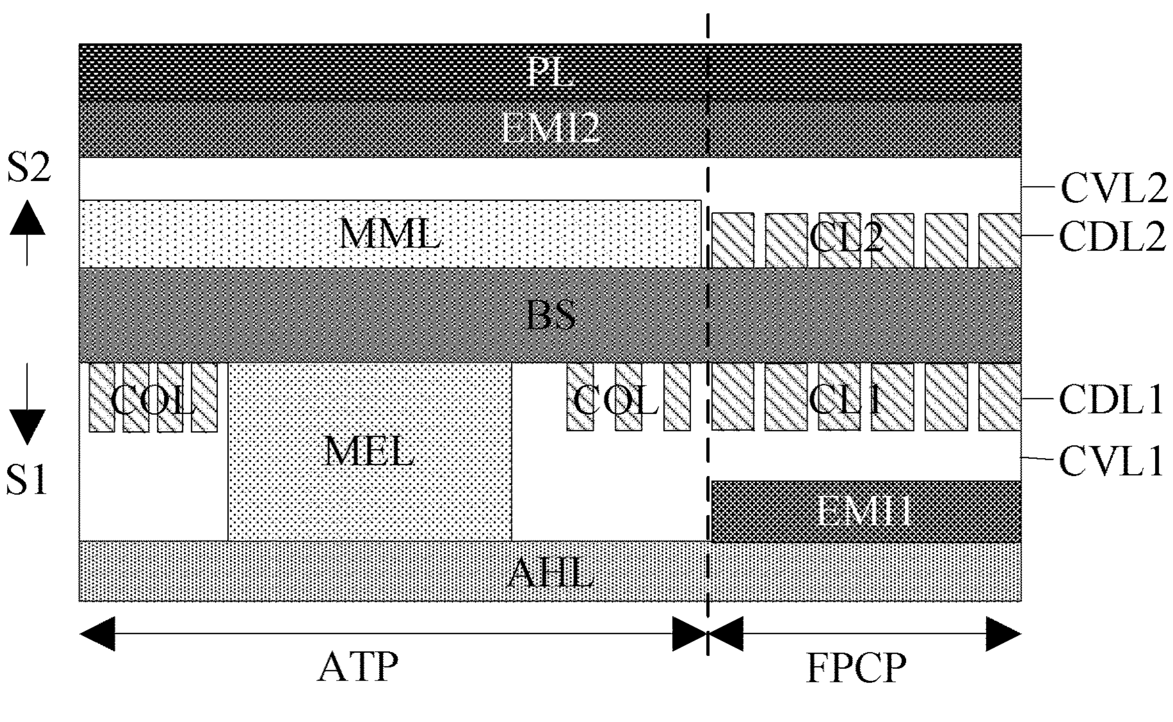
FIG. 7 is a cross-sectional view of a circuit device in some embodiments according to the present disclosure.

FIG. 7 is a cross-sectional view of a circuit device in some embodiments according to the present disclosure. The circuit device depicted in FIG. 7 differs from the circuit device depicted in FIG. 6 in that the circuit device depicted in FIG. 7 includes a second electromagnetic interference shielding layer EMI2 in lieu of the shielding layer SDL depicted in FIG. 6.

Figure 8:
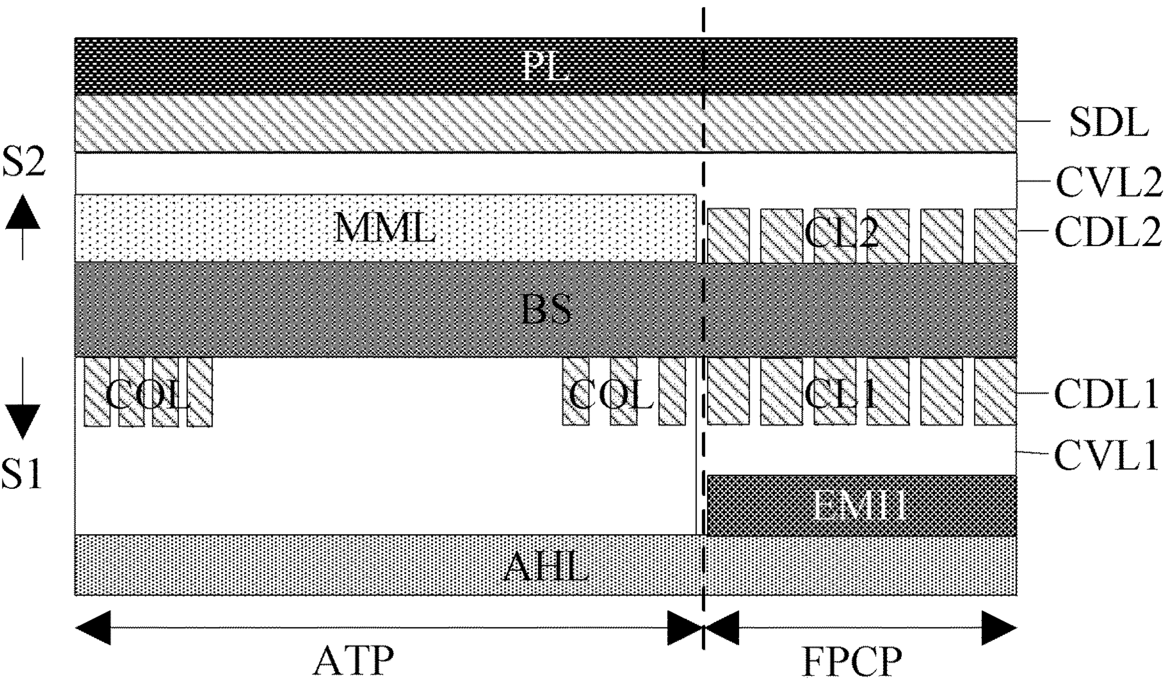
FIG. 8 is a cross-sectional view of a circuit device in some embodiments according to the present disclosure.

FIG. 8 is a cross-sectional view of a circuit device in some embodiments according to the present disclosure. The circuit device depicted in FIG. 8 differs from the circuit device depicted in FIG. 6 in that the circuit device depicted in FIG. 8 does not include a magnetic field enhancing layer MEL.

In another aspect, the present disclosure provides a display apparatus comprising the circuit device described herein, and a display panel connected to the circuit device. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

Figure 9:
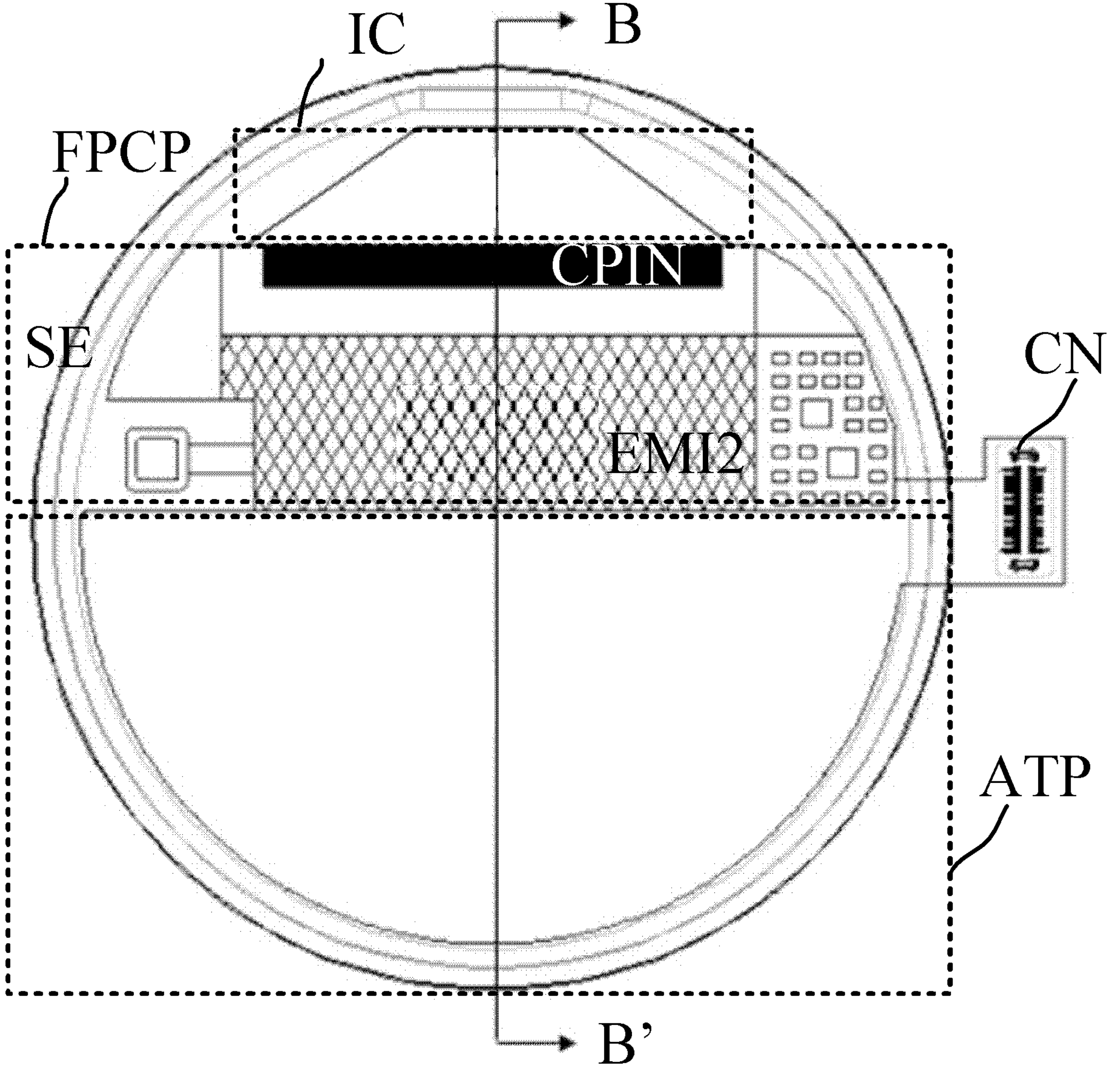
FIG. 9 is a schematic diagram illustrating the structure of a display apparatus in some embodiments according to the present disclosure.

FIG. 9 is a schematic diagram illustrating the structure of a display apparatus in some embodiments according to the present disclosure. Referring to FIG. 9, the display apparatus in some embodiments includes a flexible printed circuit portion FPCP and an antenna portion ATP, e.g., integrated together as a circuit device. The circuit device further includes a connector CN. The circuit device is connected to a motherboard of a display apparatus through the connector CN. The connector CN is integrated with the antenna portion ATP and the flexible printed circuit portion FPCP. The antenna portion ATP includes an antenna, e.g., a near field communication circuit.

Referring to FIG. 9, the display apparatus in some embodiments further includes one or more integrated circuits IC. The flexible printed circuit portion FPCP includes a plurality of circuit pins CPIN for bonding with the one or more integrated circuits IC.

In some embodiments, the flexible printed circuit portion FPCP includes one or more electromagnetic interference shielding layer (e.g., a second electromagnetic interference shielding layer EMI2 depicted in FIG. 9) configured to shield the circuit device from electromagnetic waves. For example, the one or more electromagnetic interference shielding layer may be configured to shield the circuit device from electromagnetic waves generated during wireless charging of the display panel.

In some embodiments, the circuit device further includes a sensor SE integrated with the flexible printed circuit portion FPCP. In one example, the sensor SE is a photosensor.

Figure 10:
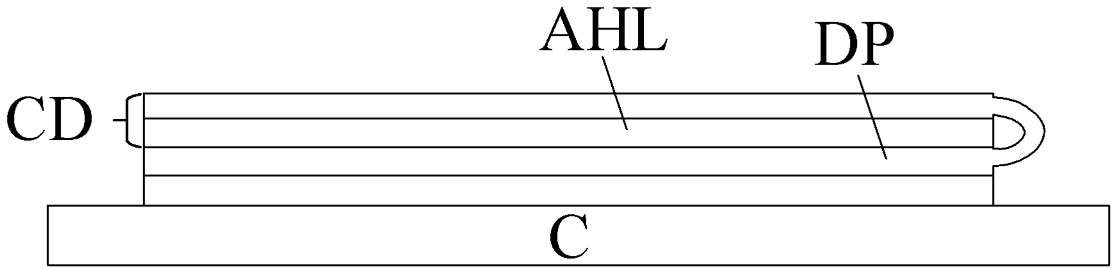
FIG. 10 is a cross-sectional view of a display apparatus in some embodiments according to the present disclosure.

FIG. 10 is a cross-sectional view of a display apparatus in some embodiments according to the present disclosure. For example, FIG. 10 may be a cross-sectional view along a B-B' line in FIG. 9. Referring to FIG. 9 and FIG. 10, the display apparatus in some embodiments includes a circuit device CD, and a display panel DP connected to the circuit device CD. The circuit device CD is adhered to a back side of the display panel DP through the adhesive layer AHL of the circuit device CD. The display apparatus in some embodiments further includes a cover C on a light emitting side of the display panel DP.

Figure 11:
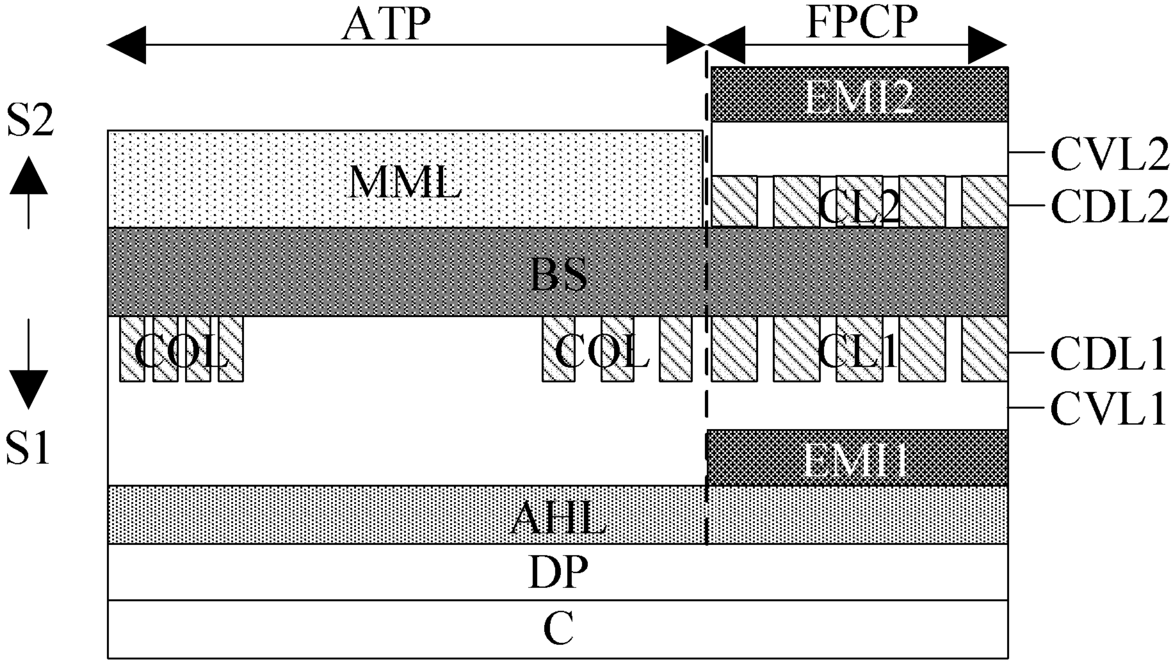
FIG. 11 is a cross-sectional view of a display apparatus in some embodiments according to the present disclosure.

FIG. 11 is a cross-sectional view of a display apparatus in some embodiments according to the present disclosure. FIG. 11 corresponds to the cross-sectional view of the circuit device depicted in FIG. 2A. Referring to FIG. 11, the display panel DP and the cover C are on the first side S1 of the base substrate BS. The display panel DP is on a side of the adhesive layer AHL away from the base substrate BS, and the cover C is on a side of the display panel DP away from the base substrate BS.

In some embodiments, the display apparatus includes a stacked structure comprising a cover C, a display panel DP on the cover C, an adhesive layer AHL on a side of the display panel DP away from the cover C, a first electromagnetic interference shielding layer EMI1 on a side of the adhesive layer AHL away from the cover C, a first coverlay layer CVL1 on a side of the first electromagnetic interference shielding layer EMI1 away from the cover C, a first conductive layer CDL1 on a side of the first coverlay layer CVL1 away from the cover C, a base substrate BS on a side of the first conductive layer CDL1 away from the cover C, a magnetic material layer MML and a second conductive layer CDL2 on a side of the base substrate BS away from the cover C, a second coverlay layer CVL2 on a side of the second conductive layer CDL2 away from the cover C, and a second electromagnetic interference shielding layer EMI2 on a side of the second coverlay layer CVL2 away from the cover C.

Figure 12:
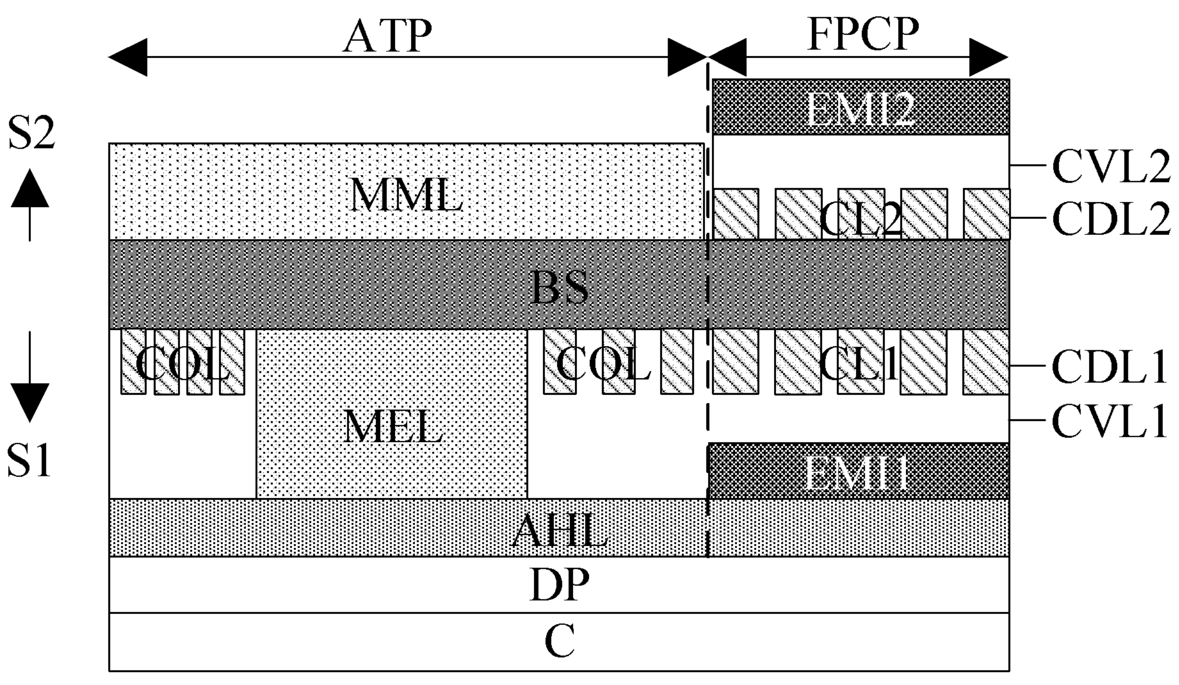
FIG. 12 is a cross-sectional view of a display apparatus in some embodiments according to the present disclosure.

FIG. 12 is a cross-sectional view of a display apparatus in some embodiments according to the present disclosure. FIG. 12 corresponds to the cross-sectional view of the circuit device depicted in FIG. 3. Referring to FIG. 12, the display apparatus includes a stacked structure comprising a cover C, a display panel DP on the cover C, an adhesive layer AHL on a side of the display panel DP away from the cover C, a first electromagnetic interference shielding layer EMI1 on a side of the adhesive layer AHL away from the cover C, a first coverlay layer CVL1 on a side of the first electromagnetic interference shielding layer EMIL away from the cover C, a first conductive layer CDL1 and a magnetic field enhancing layer MEL on a side of the first coverlay layer CVL1 away from the cover C, a base substrate BS on a side of the first conductive layer CDL1 and the magnetic field enhancing layer MEL away from the cover C, a magnetic material layer MML and a second conductive layer CDL2 on a side of the base substrate BS away from the cover C, a second coverlay layer CVL2 on a side of the second conductive layer CDL2 away from the cover C, and a second electromagnetic interference shielding layer EMI2 on a side of the second coverlay layer CVL2 away from the cover C.

Figure 13:
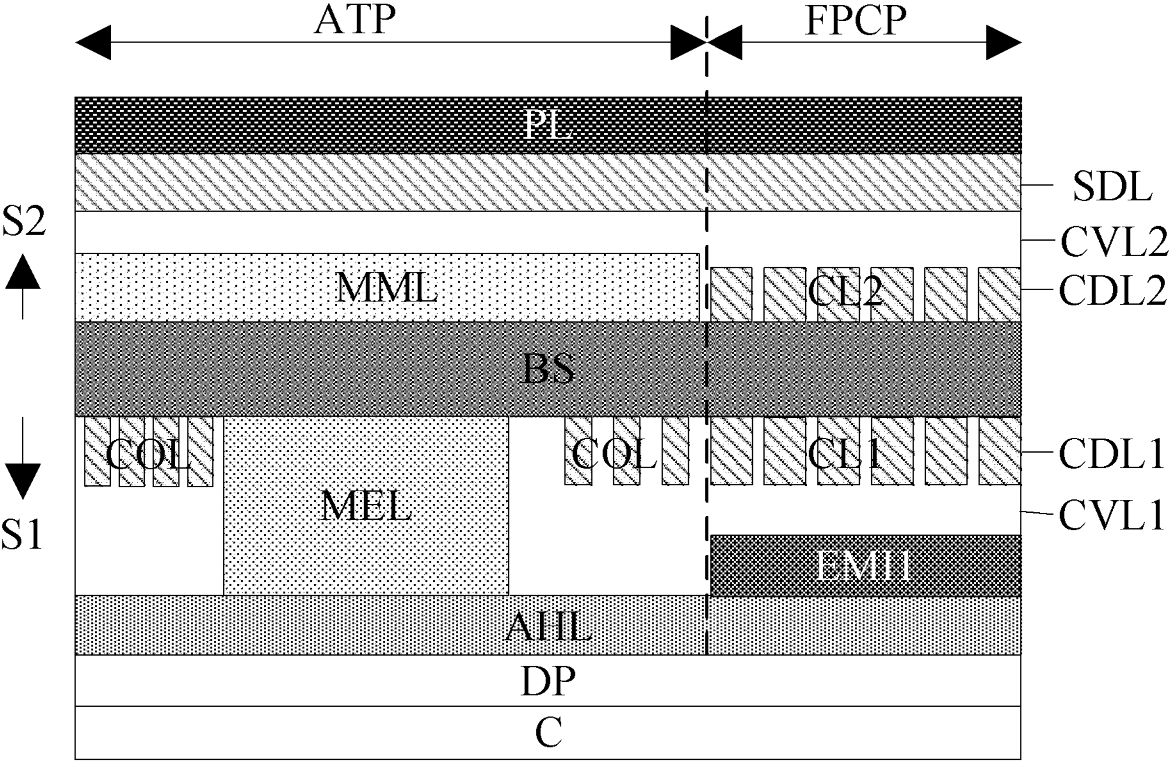
FIG. 13 is a cross-sectional view of a display apparatus in some embodiments according to the present disclosure.

FIG. 13 is a cross-sectional view of a display apparatus in some embodiments according to the present disclosure. FIG. 13 corresponds to the cross-sectional view of the circuit device depicted in FIG. 6. Referring to FIG. 13, the display apparatus includes a stacked structure comprising a cover C, a display panel DP on the cover C, an adhesive layer AHL on a side of the display panel DP away from the cover C, a first electromagnetic interference shielding layer EMI1 on a side of the adhesive layer AHL away from the cover C, a first coverlay layer CVL1 on a side of the first electromagnetic interference shielding layer EMIL away from the cover C, a first conductive layer CDL1 and a magnetic field enhancing layer MEL on a side of the first coverlay layer CVL1 away from the cover C, a base substrate BS on a side of the first conductive layer CDL1 and the magnetic field enhancing layer MEL away from the cover C, a magnetic material layer MML and a second conductive layer CDL2 on a side of the base substrate BS away from the cover C, a second coverlay layer CVL2 on a side of the magnetic material layer MML and the second conductive layer CDL2 away from the cover C, a shielding layer SDL on a side of the second coverlay layer CVL2 away from the cover C, and a protective layer PL on a side of the shielding layer SDL away from the cover C.

Figure 14:
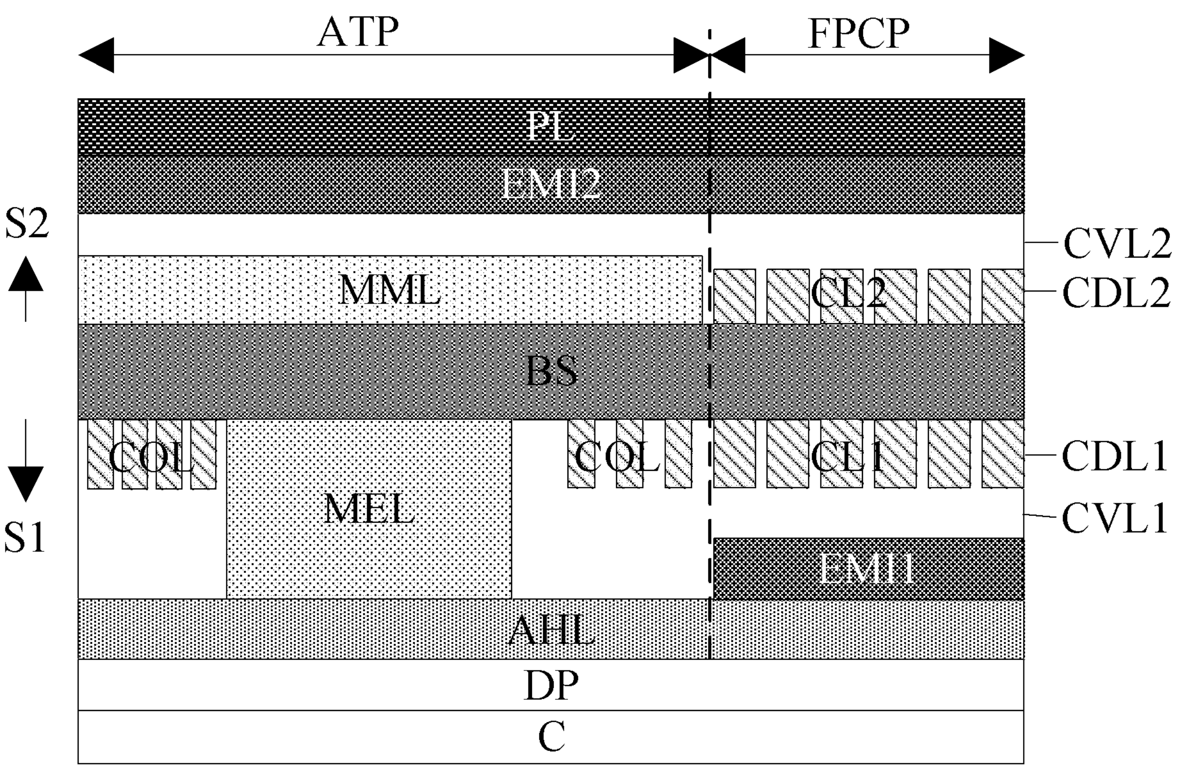
FIG. 14 is a cross-sectional view of a display apparatus in some embodiments according to the present disclosure.

FIG. 14 is a cross-sectional view of a display apparatus in some embodiments according to the present disclosure. FIG. 14 corresponds to the cross-sectional view of the circuit device depicted in FIG. 7. Referring to FIG. 14, the display apparatus includes a stacked structure comprising a cover C, a display panel DP on the cover C, an adhesive layer AHL on a side of the display panel DP away from the cover C, a first electromagnetic interference shielding layer EMI1 on a side of the adhesive layer AHL away from the cover C, a first coverlay layer CVL1 on a side of the first electromagnetic interference shielding layer EMI1 away from the cover C, a first conductive layer CDL1 and a magnetic field enhancing layer MEL on a side of the first coverlay layer CVL1 away from the cover C, a base substrate BS on a side of the first conductive layer CDL1 and the magnetic field enhancing layer MEL away from the cover C, a magnetic material layer MML and a second conductive layer CDL2 on a side of the base substrate BS away from the cover C, a second coverlay layer CVL2 on a side of the magnetic material layer MML and the second conductive layer CDL2 away from the cover C, a second electromagnetic interference shielding layer EMI2 on a side of the second coverlay layer CVL2 away from the cover C, and a protective layer PL on a side of the second electromagnetic interference shielding layer EMI2 away from the cover C.

Figure 15:
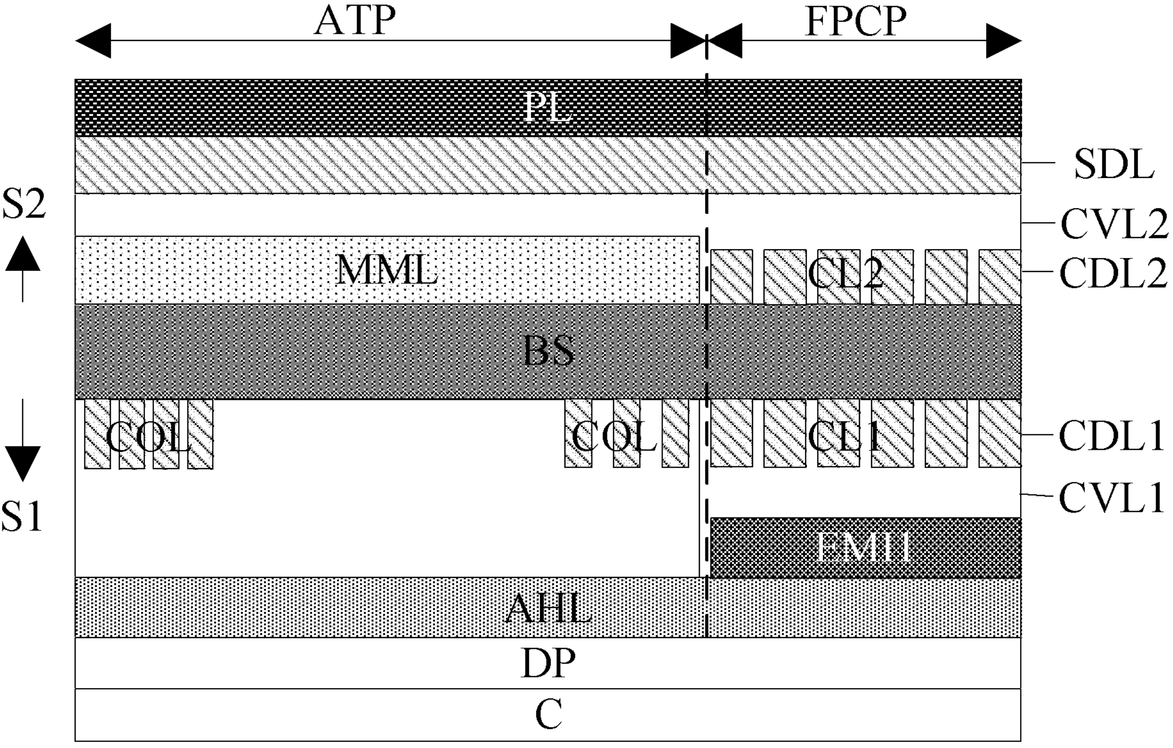
FIG. 15 is a cross-sectional view of a display apparatus in some embodiments according to the present disclosure.

FIG. 15 is a cross-sectional view of a display apparatus in some embodiments according to the present disclosure. FIG. 15 corresponds to the cross-sectional view of the circuit device depicted in FIG. 8. Referring to FIG. 15, the display apparatus includes a stacked structure comprising a cover C, a display panel DP on the cover C, an adhesive layer AHL on a side of the display panel DP away from the cover C, a first electromagnetic interference shielding layer EMI1 on a side of the adhesive layer AHL away from the cover C, a first coverlay layer CVL1 on a side of the first electromagnetic interference shielding layer EMIL away from the cover C, a first conductive layer CDL1 on a side of the first coverlay layer CVL1 away from the cover C, a base substrate BS on a side of the first conductive layer CDL1 away from the cover C, a magnetic material layer MML and a second conductive layer CDL2 on a side of the base substrate BS away from the cover C, a second coverlay layer CVL2 on a side of the magnetic material layer MML and the second conductive layer CDL2 away from the cover C, a shielding layer SDL on a side of the second coverlay layer CVL2 away from the cover C, and a protective layer PL on a side of the shielding layer SDL away from the cover C.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A circuit device, comprising a flexible printed circuit portion and an antenna portion;

wherein the circuit device comprises:

a base substrate having a unitary structure extending from a region of the antenna portion to a region of the flexible printed circuit portion;

a first conductive layer on a first side of the base substrate; and an adhesive layer on a side of a first coverlay layer and a first electromagnetic interference shielding layer away from the base substrate;

wherein the first conductive layer comprises one or more coil lines in the antenna portion and one or more first conductive lines in the flexible printed circuit portion;

wherein the adhesive layer is configured to adhere the circuit device to a display panel; and the adhesive layer has a unitary structure extending from a region of the antenna portion to a region of the flexible printed circuit portion.

2. The circuit device of claim 1, further comprising a connector configured to connect the circuit device with a motherboard of a display apparatus;

wherein the one or more coil lines in the antenna portion is directly connected to the connector.

3. The circuit device of claim 1, further comprising a first coverlay layer on a side of the first conductive layer away from the base substrate;

wherein an orthographic projection of the first coverlay layer on the base substrate at least partially overlaps with an orthographic projection of the one or more coil lines on the base substrate, and at least partially overlaps with an orthographic projection of the one or more first conductive lines on the base substrate.

4. The circuit device of claim 1, further comprising a magnetic field enhancing layer on the first side of the base substrate, the magnetic field enhancing layer being configured to enhance a magnetic field generated by the one or more coil lines;

wherein the one or more coil lines substantially surrounds the magnetic field enhancing layer.

5. The circuit device of claim 4, wherein the magnetic field enhancing layer comprises a magnetic field enhancing material; and the magnetic field enhancing material comprises a metal or an alloy.

6. The circuit device of claim 1, further comprising a first electromagnetic interference shielding layer on a side of a first coverlay layer away from the base substrate, the first electromagnetic interference shielding layer being configured to shield the flexible printed circuit portion from electromagnetic waves;

wherein an orthographic projection of the first electromagnetic interference shielding layer on the base substrate at least partially overlaps with an orthographic projection of the one or more first conductive lines in the flexible printed circuit portion on the base substrate.

7. A circuit device, comprising a flexible printed circuit portion and an antenna portion;

wherein the circuit device comprises:

a base substrate having a unitary structure extending from a region of the antenna portion to a region of the flexible printed circuit portion;

a first conductive layer on a first side of the base substrate; and a second conductive layer on a second side of the base substrate, the second side being opposite to the first side;

wherein the first conductive layer comprises one or more coil lines in the antenna portion and one or more first conductive lines in the flexible printed circuit portion;

wherein the second conductive layer is configured to shield the flexible printed circuit portion from electromagnetic waves; and an orthographic projection of the second conductive layer on the base substrate at least partially overlaps with an orthographic projection of the one or more first conductive lines in the flexible printed circuit portion on the base substrate.

8. The circuit device of claim 1, further comprising a magnetic material layer on a second side of the base substrate, the second side being opposite to the first side;

wherein the magnetic material layer is configured to guide magnetic flux generated by the one or more coil lines; and an orthographic projection of the magnetic material layer on the base substrate at least partially overlaps with an orthographic projection of the one or more coil lines and/or a magnetic field enhancing layer on the base substrate.

9. The circuit device of claim 8, wherein the magnetic material layer comprises a ferrimagnetic material.

10. The circuit device of claim 1, further comprising a second coverlay layer on a side of a second conductive layer away from the base substrate;

wherein an orthographic projection of the second coverlay layer on the base substrate at least partially overlaps with an orthographic projection of the one or more first conductive lines on the base substrate.

11. The circuit device of claim 10, wherein the second coverlay layer has a unitary structure extending from a region of the antenna portion to a region of the flexible printed circuit portion; and the orthographic projection of the second coverlay layer on the base substrate at least partially overlaps with an orthographic projection of the one or more coil lines on the base substrate.

12. The circuit device of claim 1, further comprising a second electromagnetic interference shielding layer on a side of a second coverlay layer away from the base substrate, the second electromagnetic interference shielding layer being configured to shield the flexible printed circuit portion from electromagnetic waves;

wherein an orthographic projection of the second electromagnetic interference shielding layer on the base substrate at least partially overlaps with an orthographic projection of the one or more first conductive lines in the flexible printed circuit portion on the base substrate.

13. The circuit device of claim 12, wherein the second electromagnetic interference shielding layer has a unitary structure extending from a region of the antenna portion to a region of the flexible printed circuit portion; and the orthographic projection of the second electromagnetic interference shielding layer on the base substrate at least partially overlaps with an orthographic projection of the one or more coil lines in the antenna portion on the base substrate.

14. The circuit device of claim 1, further comprising a shielding layer on a side of a second coverlay layer away from the base substrate, the shielding layer being configured to shield the flexible printed circuit portion from electromagnetic waves;

wherein an orthographic projection of the shielding layer on the base substrate at least partially overlaps with an orthographic projection of the one or more first conductive lines in the flexible printed circuit portion on the base substrate;

the shielding layer has a unitary structure extending from a region of the antenna portion to a region of the flexible printed circuit portion; and the orthographic projection of the shielding layer on the base substrate at least partially overlaps with an orthographic projection of the one or more coil lines in the antenna portion on the base substrate.

15. The circuit device of claim 1, further comprising a protective layer on a side of a second electromagnetic interference shielding layer or a shielding layer away from the base substrate.

16. The circuit device of claim 1, wherein the one or more coil lines has a first thickness greater than a second thickness of the one or more first conductive lines.

17. The circuit device of claim 1, wherein the one or more coil lines have a first average line width;

the one or more first conductive lines have a second average line width;

the first average line width is greater than the second average line width;

coil lines of the one or more coil lines are spaced apart by a first average distance;

first conductive lines of the one or more first conductive lines are spaced apart by a second average distance; and the first average distance is greater than the second average distance.

18. A display apparatus, comprising a circuit device, and a display panel connected to the circuit device;

wherein the circuit device comprises a flexible printed circuit portion and an antenna portion;

wherein the circuit device comprises:

a base substrate having a unitary structure extending from a region of the antenna portion to a region of the flexible printed circuit portion; and a first conductive layer on a first side of the base substrate;

wherein the first conductive layer comprises one or more coil lines in the antenna portion and one or more first conductive lines in the flexible printed circuit portion;

wherein the display apparatus comprises a stacked structure;

wherein the stacked structure comprises:

a cover;

the display panel on the cover;

an adhesive layer on a side of the display panel away from the cover;

a first electromagnetic interference shielding layer on a side of the adhesive layer away from the cover;

a first coverlay layer on a side of the first electromagnetic interference shielding layer away from the cover;

the first conductive layer on a side of the first coverlay layer away from the cover; and the base substrate on a side of the first conductive layer away from the cover.

* * * * *